US012010416B1

(12) United States Patent
Shi et al.

(10) Patent No.: US 12,010,416 B1
(45) Date of Patent: Jun. 11, 2024

(54) CAMERA MODULE INCLUDING EMBEDDED CERAMIC SUBSTRATE PACKAGE

(71) Applicant: Apple Inc., Cupertino, CA (US)

(72) Inventors: Wei Shi, San Jose, CA (US); Adar Magen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 507 days.

(21) Appl. No.: 17/024,024

(22) Filed: Sep. 17, 2020

Related U.S. Application Data

(60) Provisional application No. 62/907,253, filed on Sep. 27, 2019.

(51) Int. Cl.
| | | |
|---|---|---|
| *H04N 23/57* | (2023.01) | |
| *H01L 27/146* | (2006.01) | |
| *H04N 23/54* | (2023.01) | |
| *H04N 23/55* | (2023.01) | |
| *H04N 23/60* | (2023.01) | |

(52) U.S. Cl.
CPC ....... *H04N 23/57* (2023.01); *H01L 27/14618* (2013.01); *H01L 27/14627* (2013.01); *H01L 27/14636* (2013.01); *H01L 27/14683* (2013.01); *H04N 23/54* (2023.01); *H04N 23/60* (2023.01); *H04N 23/55* (2023.01)

(58) Field of Classification Search
CPC .............. H04N 5/2257; H04N 5/232; H04N 5/225–2257; H04N 23/54; H04N 23/57; H04N 23/60; H01L 27/14618; H01L 27/14627; H01L 27/14636; H01L 27/14683; H05K 1/185; H05K 3/0014; H05K 3/10; H05K 3/101; H05K 3/103; H05K 3/284; H05K 5/0034; H05K 2201/05; H05K 2201/09118; H05K 2201/09218; H05K 2201/095; H05K 2201/10666; H05K 2201/10674; H05K 2203/1305–1327
See application file for complete search history.

(56) References Cited

U.S. PATENT DOCUMENTS

| | | | |
|---|---|---|---|
| 6,661,084 B1 * | 12/2003 | Peterson | H01L 23/10 257/737 |
| 7,498,556 B2 * | 3/2009 | Yang | H01L 27/14685 250/239 |
| 8,658,966 B2 | 2/2014 | Ha | |

(Continued)

OTHER PUBLICATIONS

BMC NPL—WayBackMachine Screenshot (on Mar. 20, 2017), Bulk Molding Compound, Wikipedia, p. 1 Weblink: https://web.archive.org/web/20170320225453/https://en.wikipedia.org/wiki/Bulk_moulding_compound (Year: 2017).*

(Continued)

*Primary Examiner* — Twyler L Haskins
*Assistant Examiner* — Akshay Trehan
(74) *Attorney, Agent, or Firm* — Robert C. Kowert; Kowert, Hood, Munyon, Rankin & Goetzel, P.C.

(57) ABSTRACT

An embedded ceramic substrate package includes a ceramic substrate embedded in one or more layers. The one or more layers include at least a bulk molding compound (BMC) and a redistribution layer (RDL). At least a portion of the one or more layers includes electrical signal trace routing. The embedded ceramic substrate package is attached to an image sensor that is configured to capture light projected onto a surface of the image sensor.

20 Claims, 22 Drawing Sheets

(56) References Cited

U.S. PATENT DOCUMENTS

| | | | | |
|---|---|---|---|---|
| 10,319,688 | B2* | 6/2019 | Wolter | H01Q 1/526 |
| 2008/0083980 | A1* | 4/2008 | Yang | H01L 27/14683 |
| | | | | 257/E27.15 |
| 2008/0157250 | A1* | 7/2008 | Yang | H04N 23/55 |
| | | | | 257/E31.127 |
| 2008/0173792 | A1* | 7/2008 | Yang | H01L 27/14636 |
| | | | | 250/208.1 |
| 2009/0014822 | A1* | 1/2009 | Poo | H01L 27/14683 |
| | | | | 257/E31.127 |
| 2009/0267209 | A1* | 10/2009 | Shizuno | H01L 27/14618 |
| | | | | 257/E23.18 |
| 2010/0295178 | A1* | 11/2010 | Ishihara | H05K 1/187 |
| | | | | 257/737 |
| 2011/0096219 | A1* | 4/2011 | Lee | H01L 24/97 |
| | | | | 257/E31.127 |
| 2016/0240492 | A1* | 8/2016 | Wolter | H01L 23/66 |
| 2018/0090530 | A1* | 3/2018 | Jeong | H01L 27/14636 |
| 2018/0130750 | A1* | 5/2018 | Jung | H01L 23/5389 |
| 2018/0211989 | A1* | 7/2018 | Hogyoku | H01L 24/18 |
| 2019/0139843 | A1* | 5/2019 | Shigeta | H01L 23/12 |
| 2019/0318972 | A1* | 10/2019 | Nagai | H05K 1/185 |
| 2020/0161289 | A1* | 5/2020 | Chen | H01L 24/95 |
| 2021/0195076 | A1* | 6/2021 | Chen | H04N 23/56 |
| 2021/0208418 | A1* | 7/2021 | Liu | H04N 23/54 |
| 2022/0132059 | A1* | 4/2022 | Momiuchi | H04N 25/70 |
| 2022/0262841 | A1* | 8/2022 | Shigeta | H01L 27/14618 |

OTHER PUBLICATIONS

Ceramic NPL—WayBackMachine Screenshot (on Aug. 25, 2019), Ceramic Definition, Wikipedia (pp. 1-2) Weblink: https://web.archive.org/web/20190825153054/https://en.wikipedia.org/wiki/Ceramic (Year: 2019).*

* cited by examiner

102
Camera
Module (including
embedded
ceramic
substrate
package
attached
to an image
sensor)

100

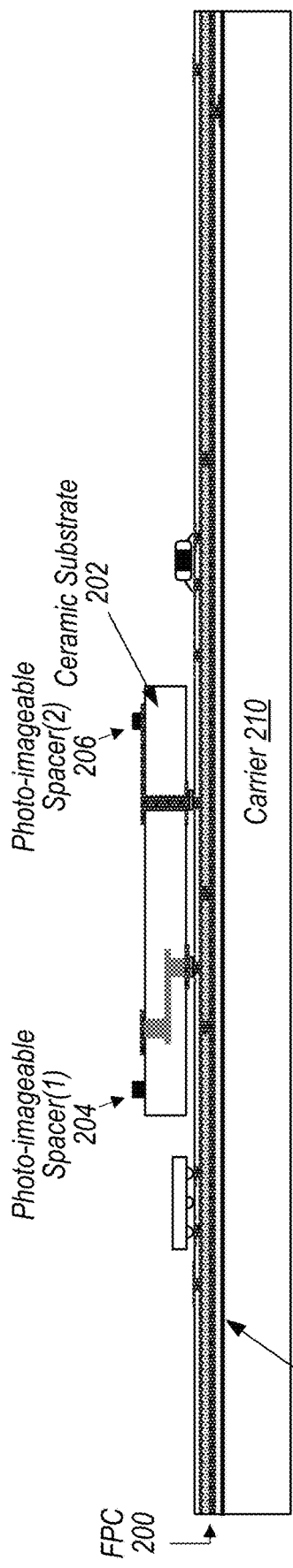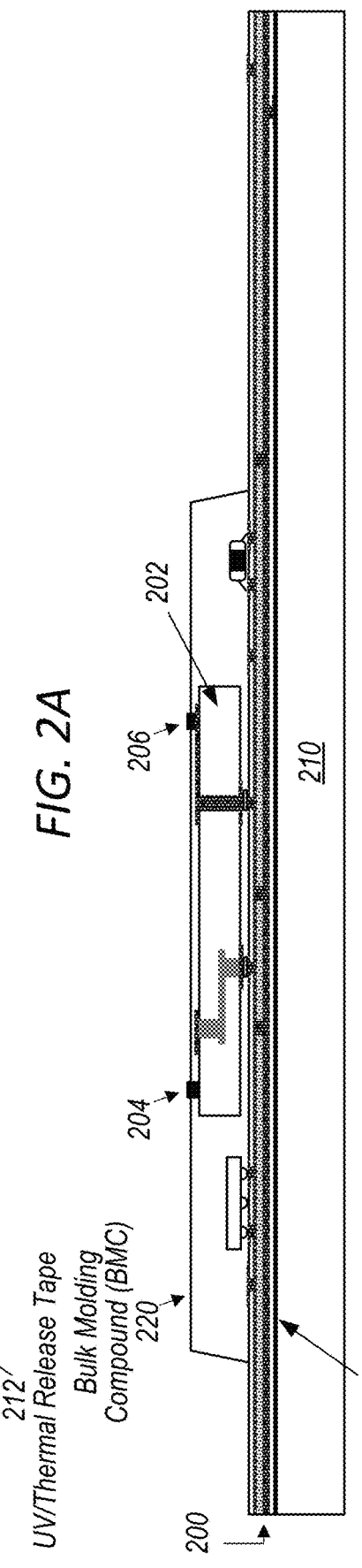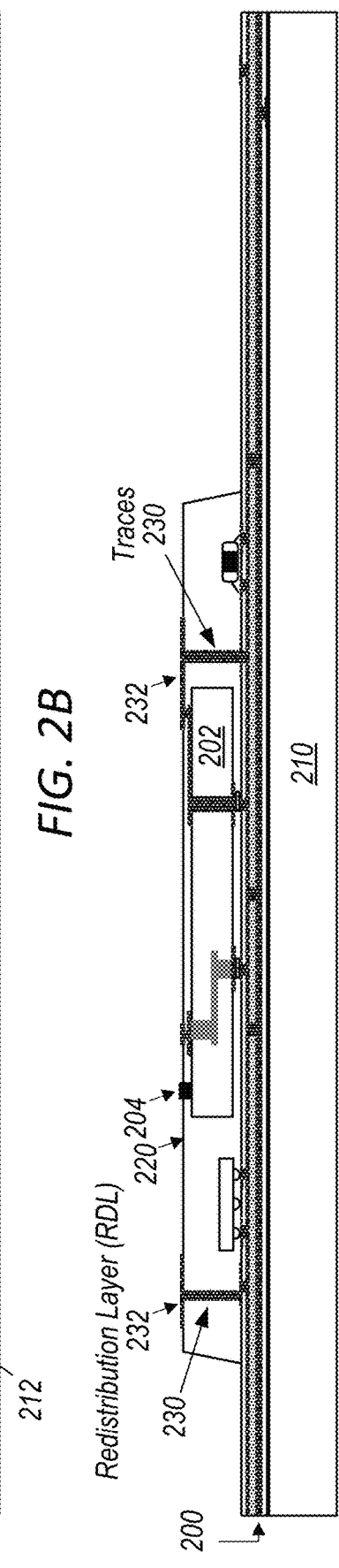

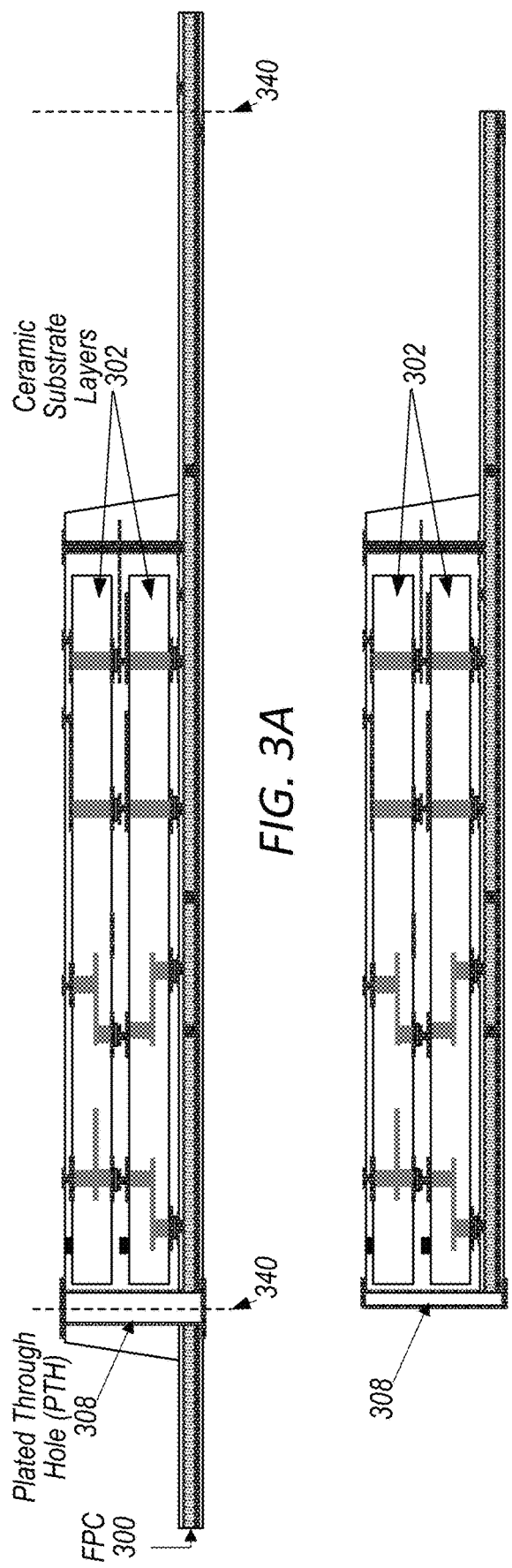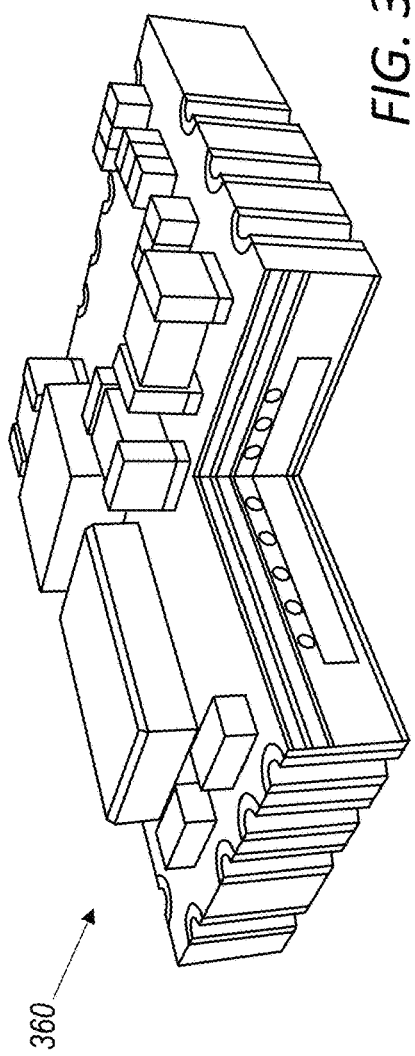
FIG. 3A
FIG. 3B
FIG. 3C

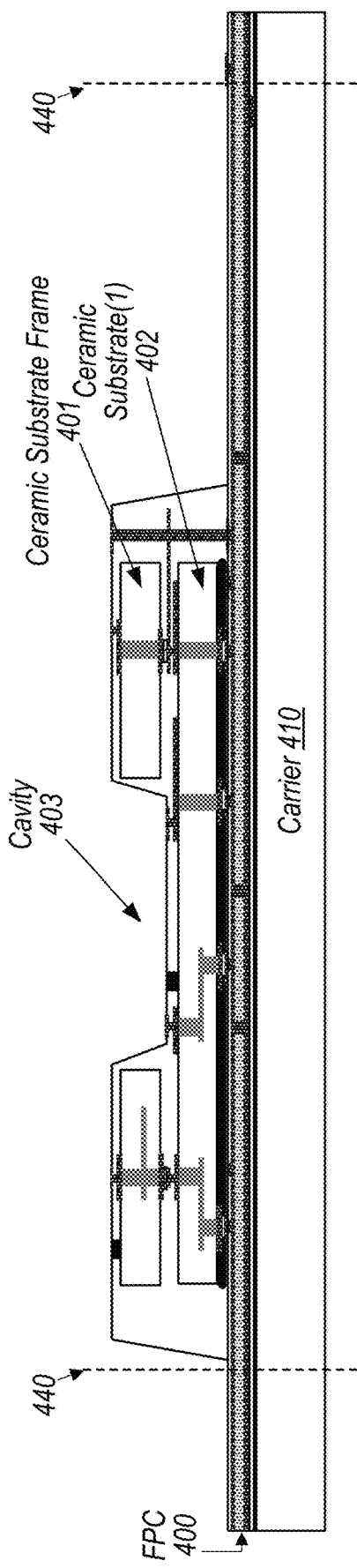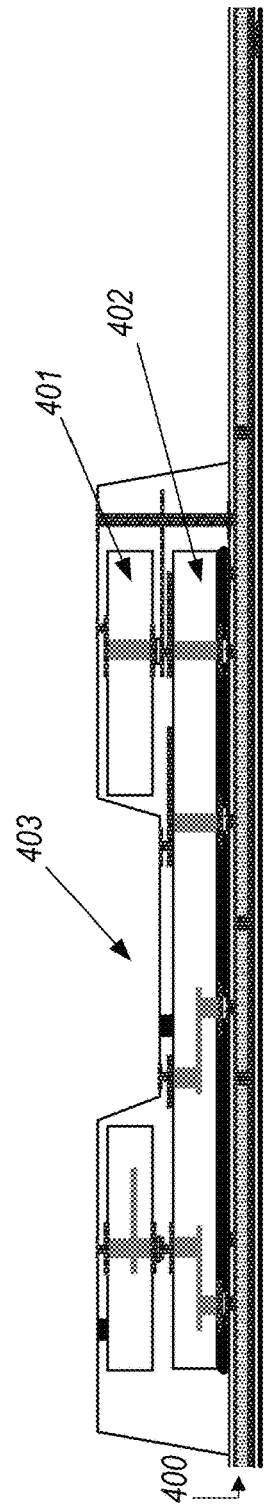

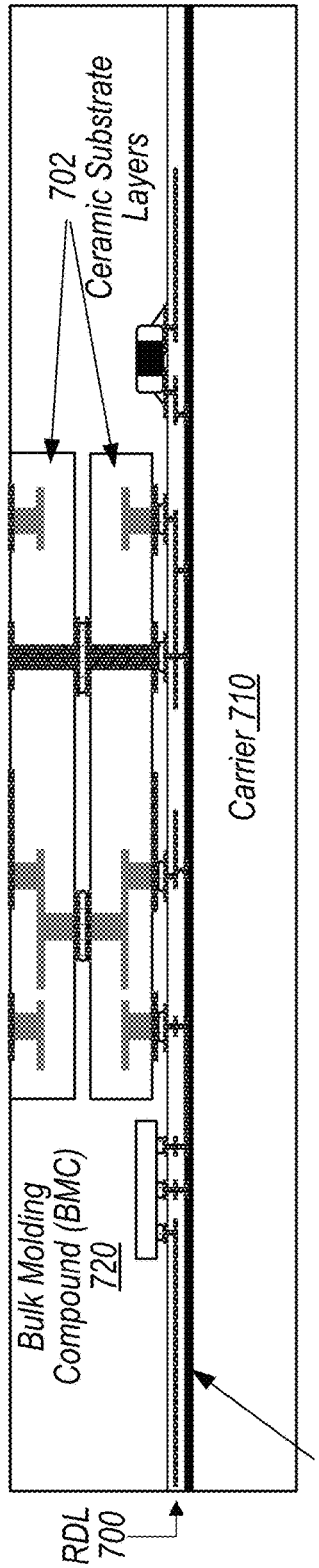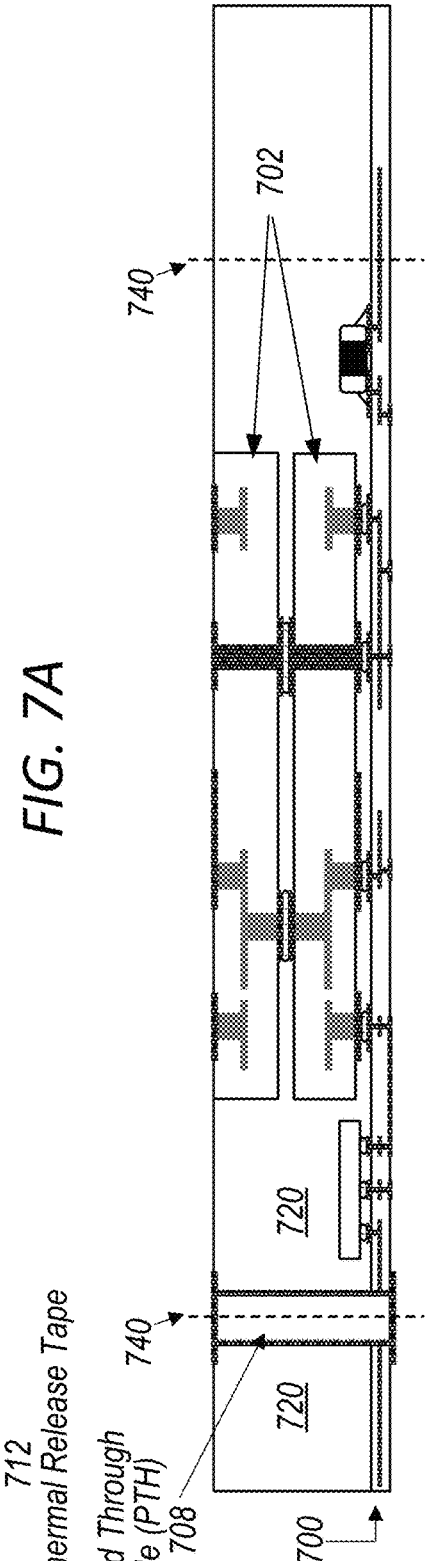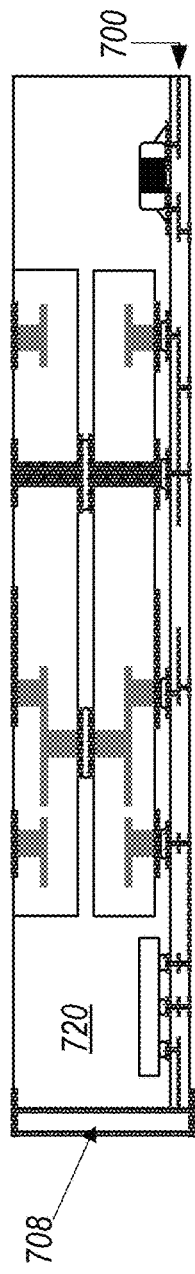
FIG. 7A
FIG. 7B
FIG. 7C

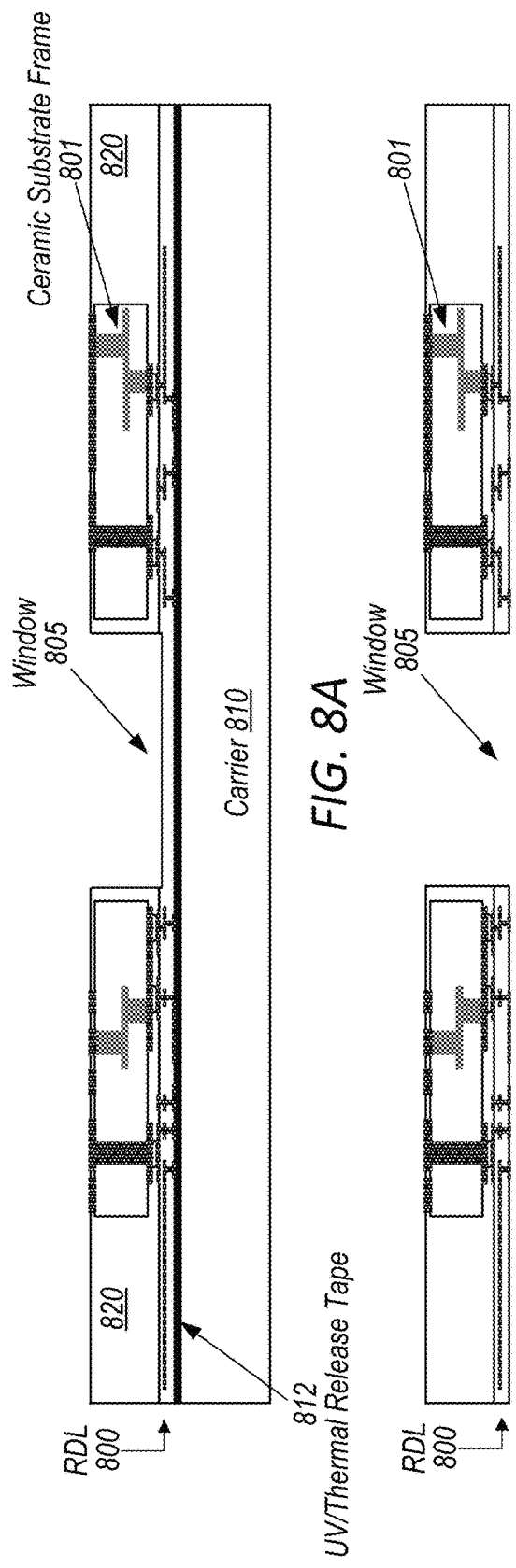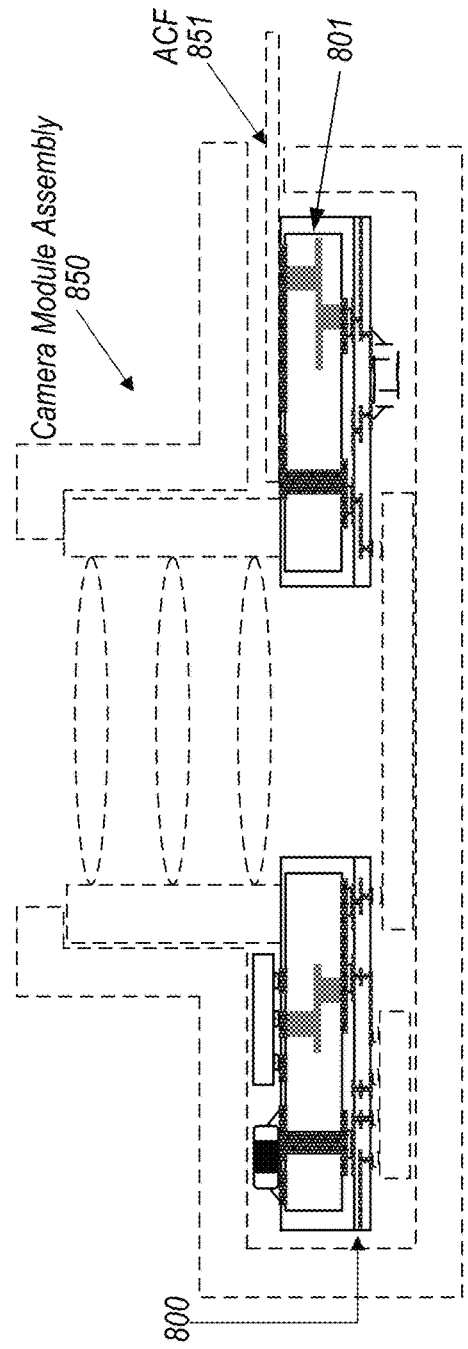

CAMERA MODULE INCLUDING EMBEDDED CERAMIC SUBSTRATE PACKAGE

This application claims benefit of priority to U.S. Provisional Application Ser. No. 62/907,253, entitled "Camera Module Including Embedded Ceramic Substrate Package," filed Sep. 27, 2019, and which is incorporated herein by reference in its entirety.

BACKGROUND

Technical Field

This disclosure relates generally to cameras, and more specifically to camera modules including embedded ceramic substrate packages.

Description of the Related Art

The advent of small, mobile multipurpose devices such as smartphones and tablet or pad devices has resulted in a need for high-resolution, small form factor cameras for integration in the devices. However, due to limitations of conventional camera technology, conventional small cameras used in such devices tend to capture images at lower resolutions and/or with lower image quality than can be achieved with larger, higher quality cameras. Achieving higher resolution with small package size cameras generally requires use of a photosensor with small pixel size and a good, compact imaging lens system. Advances in technology have achieved reduction of the pixel size in photosensors. However, as photosensors become more compact and powerful, demand for compact imaging lens system with improved imaging quality performance has increased. In addition, there are increasing expectations for small form factor cameras to be equipped with higher pixel count and/or larger pixel size image sensors (one or both of which may require larger image sensors) while still maintaining a module height that is compact enough to fit into portable electronic devices. Thus, a challenge from an optical system design point of view is to provide an imaging lens system that is capable of capturing high brightness, high resolution images under the physical constraints imposed by small form factor cameras.

SUMMARY OF EMBODIMENTS

Embodiments of the present disclosure include various embedded ceramic substrate packages, camera modules that include one or more of the embedded ceramic substrate packages, processes for forming the embedded ceramic substrate packages, and mobile devices including one or more of the camera modules. Each of the embedded ceramic substrate packages disclosed herein include a ceramic substrate embedded in one or more layers. The one or more layers include at least a bulk molding compound (BMC) and a redistribution layer (RDL). At least a portion of the one or more layers includes electrical signal trace routing. Each of the embedded ceramic substrate packages disclosed herein is attached to an image sensor that is configured to capture light projected onto a surface of the image sensor.

In some embodiments of the present disclosure, an embedded ceramic substrate package is disclosed. The embedded ceramic substrate package includes a ceramic substrate embedded in one or more layers. The one or more layers include at least a BMC and a RDL. At least a portion of the layer(s) includes electrical signal trace routing. The embedded ceramic substrate package is attached to an image sensor that is configured to capture light projected onto a surface of the image sensor.

In some embodiments of the present disclosure, a camera module is disclosed. The camera module includes an image sensor and an embedded ceramic substrate package attached to the image sensor. The embedded ceramic substrate package includes a ceramic substrate embedded in one or more layers. The one or more layers include at least a BMC and a RDL, and at least a portion of the layer(s) includes electrical signal trace routing.

In some embodiments of the present disclosure, a process for forming an embedded ceramic substrate package is disclosed. The process utilizes a manufacturing process that includes building up from a flexible printed circuit (FPC). The embedded ceramic substrate package includes a ceramic substrate embedded in one or more layers. The one or more layers include at least a BMC and a RDL, and at least a portion of the layer(s) includes electrical signal trace routing. The process also includes attaching the embedded ceramic substrate package to an image sensor that is configured to capture light projected onto a surface of the image sensor.

In some embodiments of the present disclosure, a process for forming an embedded ceramic substrate package is disclosed. The process utilizes a manufacturing process that includes building up from a RDL. The embedded ceramic substrate package includes a ceramic substrate embedded in one or more layers. The one or more layers include at least a BMC, and at least a portion of the layer(s) includes electrical signal trace routing. The process also includes attaching the embedded ceramic substrate package to an image sensor that is configured to capture light projected onto a surface of the image sensor.

In some embodiments of the present disclosure, a mobile device is disclosed. The mobile device includes one or more processors, one or more cameras, and a memory. The memory includes program instructions that are executable by at least one processor to control operations of the camera(s). At least one camera of the mobile device includes a camera module that includes an image sensor and an embedded ceramic substrate package attached to the image sensor. The image sensor configured to capture light projected onto a surface of the image sensor. The embedded ceramic substrate package includes a ceramic substrate embedded in one or more layers. The one or more layers include at least a BMC and a RDL, and at least a portion of the layer(s) includes electrical signal trace routing.

BRIEF DESCRIPTION OF THE DRAWINGS

FIGS. 2A through 2E illustrate a first example of a process of forming a package structure including an embedded ceramic substrate by building up from a flexible printed circuit (FPC), according to some embodiments.

FIGS. 3A through 3C illustrate a second example of a process of forming a package structure including an embedded ceramic substrate by building up from a FPC, according to some embodiments.

FIGS. 4A and 4B illustrate a third example of a process of forming a package structure including an embedded ceramic substrate by building up from a FPC, according to some embodiments.

FIGS. 7A through 7C illustrate a second example of a process of forming a package structure including an embedded ceramic substrate by building up from a RDL, according to some embodiments.

FIGS. 8A through 8C illustrate a third example of a process of forming a package structure including an embedded ceramic substrate by building up from a RDL, according to some embodiments.

Figure 1:
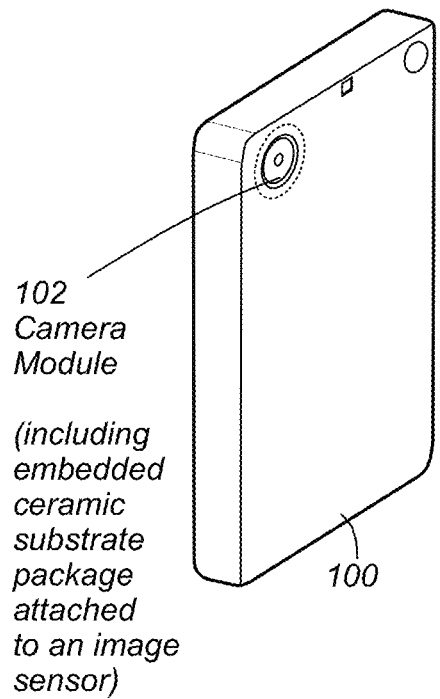
FIG. 1 illustrates a mobile device including a camera module having an embedded ceramic substrate package attached to an image sensor, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ". Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Embodiments described herein provide various processes of manufacturing embedded ceramic substrate packages for use in camera modules (e.g., small form factor cameras for use in mobile devices, such as smart phones, tablets, etc.). In some embodiments, such camera modules may be used for front/rear/depth cameras. The embedded ceramic substrate packages are attached to an image sensor associated with a particular camera module, such as image sensors for front/rear/depth camera modules.

This disclosure relates to a fan out panel level packaging (or fan out wafer level packaging) process, also referred to as a FOPLP or FOWLP process, that uses a ceramic substrate and one or more additional layers (e.g., to provide additional trace routing complexity). The additional layer(s) may include, for example, a redistribution layer (RDL) and/or a bulk molding compound (BMC). An image sensor (e.g., of a camera module) may then be connected to the overall substrate.

In some embodiments, the FOPLP process may include placing one or more ceramic substrates on a flexible printed circuit board (FPC) and embedding the ceramic substrate(s) by overmolding with a bulk molding compound (which can be used for trace routing). In some examples, the ceramic substrate(s) can be a substrate with double-sided circuits on its top and bottom surface. Furthermore, the ceramic substrate can be a single-layer substrate or a multiple-layer substrate. As noted above, the bulk molding compound can be used for trace routing. For example, in some embodiments, the process may include laser drilling vias through the bulk molding compound. The overmolding process may be repeated if additional redistribution layers are desired. In some examples, multiple ceramic substrates may be stacked up (e.g., with one or more layers in-between). The overmolding process may be used to embed the ceramic substrates and to provide side wall connects.

In some embodiments, the FOPLP process may include building a redistribution layer with trace routing, then placing a ceramic substrate on the redistribution layer and embedding the ceramic substrate by overmolding with a bulk molding compound. The image sensor may be connected to the redistribution layer in the overall camera package.

Although high-temperature co-fired ceramic (HTCC) substrates provide good mechanical stability and reliability, there are numerous challenges associated with HTCC substrates. For example, one challenge associated with HTCC substrates is a higher resistance of the conductor, compared to a copper conductor. Another challenge associated with HTCC substrates is larger line width/space and via size compared to RDL or FPC technology, due to the screen printing of the metal patterns. A further challenge associated with HTCC substrates is relatively poor mechanical tolerances, due to shrinkage (e.g., about 15 to 20 percent) of the "green sheet" (e.g., a tungsten-based material) used to form the HTCC substrate after co-firing at a typical temperature of about 1500° C. Such shortcomings of HTCC technology are becoming obstacles in the development of new camera modules with high input/output (I/O) density, low power consumption, high signal speed, good module manufacturability, and compact mechanical design. Other traditional substrate technologies, such as printed circuit board (PCB), flexible printed circuit (FPC), HTCC, LTCC ("low-temperature co-fired ceramic), silicon (Si) wafer, glass, etc. are unable to solve the above issues without creating other fundamental issues. Accordingly, to address shortcomings associated with various conventional substrate technologies, the present disclosure is directed to a variety of novel approaches to making different structures of substrates for various camera modules or depth camera modules.

The present disclosure describes a series of concepts in design and manufacturing process to enable desired specifications in electrical, optical, mechanical, thermal, process, and reliability (among others). The present disclosure describes embedding a ceramic substrate or partial layers of the ceramic substrate, SMDs, and IC chips into FOPLP with carefully-selected molding compound, to provide well-balanced, satisfactory mechanical properties. For example, with respect to a coefficient of thermal expansion (CTE), various designs according to the present disclosure provide substantially the same CTE as HTCC in the optical area, with the general CTE in a range of about 7 to 9 ppm/° C., with the instability of thin RDL on ceramic proving to be negligible. With respect to flexural strength, thin RDL and BMC around ceramic substrate help to absorb shock energy, thereby reducing the brittleness of the ceramic substrate. As another example, as all processing occurs at a temperature below 250° C., there is a significant reduction in warpage compared to a typical processing temperature of about 1600° C. for an HTCC substrate. Further, the processes described herein provide high accuracy, as all the traces that directly connect to the electrical components are all copper with patterns defined by lithography, and 20 µm/20 µm line width/space is manufacturable in a FOPLP process. Still further, by eliminating HTCC warpage and replacing some HTCC layers with thin RDL, the total Z height may be reduced (e.g., ±25-60 µm).

Such a substrate, as described herein, also enables various electrical designs of: low resistivity in conductor (copper versus tungsten/molybdenum paste), with lower power consumption; higher signal speed, with better signal integrity (FOPLP interconnection can enable RF signals beyond 30 GHz); and higher I/O density with fine line width/space and micro vias. In one of the embodiments described herein, the substrate can be built up from FPC with a panel-level process. In this process, eliminating the ACF enables high-speed signals, improves reliability, and reduces potential cost. Additionally, the FOPLP process is very flexible, enabling manufacture of different structures of substrates for various camera modules.

The FOPLP process is also based on the FOWLP process but using the technologies of PCB for reduced cost. One example of an industrial PCB format is an 18 inch×24 inch design (with a corresponding surface area of about 432 square inches), while another example of a next generation PCB format is a 21 inch×24 inch design (with a corresponding surface area of about 504 square inches). Typical wafer designs include a 6-inch diameter circular design (~28 in$^2$); an 8-inch strip design (~24 in$^2$); an 8-inch diameter circular design (about 50 in$^2$); a 12-inch diameter circular design (about 113 in$^2$); and an 18-inch diameter circular design (about 254 in$^2$). Thus, even the largest 18-inch circular wafer design, with a corresponding surface area of about 254 square inches, does not offer such high integration potential as either of the aforementioned PCB formats, with corresponding surface areas of about 432 or 504 square inches. Further, the semi-additive metal formation process associated with an FOPLP process has a demonstrated capability of a line/width spacing of 20 µm/20 µm, with literature showing 18 µm line/11 µm spacing in one example of a panel-level embedded PCB process.

In the present disclosure, as the ceramic substrate to be embedded may be a double-sided circuit in some embodiments, a face-down process may be utilized to attach a substrate/die/SMD onto FPC or RDL to achieve an accurate positioning of the substrate/die/SMD. Meanwhile, in order to obtain the exposed surface of the ceramic substrate, exposed-die molding process/equipment may be utilized. In the present disclosure, a variety package structures may be formed. A first example package structure of the present disclosure is an embedded single piece of ceramic substrate, for wire-bond CIS. A second example package structure of the present disclosure is an embedded stack of two pieces of ceramic substrate, with side-wall connects for 3-dimensional of DOE in a depth camera. A third example package structure of the present disclosure is an embedded ceramic substrate frame on ceramic substrate, with cavity, for flip chip or wire bonding of CIS. A fourth example package structure of the present disclosure is an embedded ceramic substrate frame on ceramic substrate frame, with cavity and window, for flip chip bonding of CIS. As further described herein, various options are described for manufacturing processes to form such package structures by either building up from FPC or building up from RDL.

Embodiments of the camera module(s) including the embedded ceramic substrate package(s) as described herein may be implemented in a small package size while still capturing sharp, high-resolution images, making embodiments of the camera module(s) suitable for use in small and/or mobile multipurpose devices such as cell phones, smartphones, pad or tablet computing devices, laptop, netbook, notebook, subnotebook, and ultrabook computers, and so on. FIGS. 19A-C and 20 illustrate example devices that may include one or more small form factor cameras that use embodiments of one or more of the camera modules as described herein. However, note that aspects of the camera may be scaled up or down to provide cameras with larger or smaller package sizes. In addition, embodiments of the camera may be implemented as stand-alone digital cameras. In addition to still (single frame capture) camera applications, embodiments of the camera may be adapted for use in video camera applications.

FIG. 1 is a diagram illustrating a mobile device 100 including a camera module 102 having an embedded ceramic substrate package, according to some embodiments.

The camera module 102 includes an image sensor configured to capture light projected onto a surface of the image sensor. The camera module 102 further includes an embedded ceramic substrate package attached to the image sensor. The embedded ceramic substrate package includes a ceramic substrate embedded in one or more layers, with the layer(s) including at least a bulk molding compound. At least a portion of the layer(s) includes electrical signal trace routing.

As further described herein, in some embodiments of the present disclosure, the ceramic substrate of the embedded ceramic substrate package of the camera module 102 overlies a FPC, and the ceramic substrate overlying the FPC is overmolded with a BMC. In some cases, at least a portion of the electrical signal trace routing is disposed within the BMC. Further, in some cases, the image sensor of the camera module 102 is electrically connected to the electrical signal trace routing disposed within the BMC.

As further described herein, in some embodiments of the present disclosure, at least a portion of the RDL includes the electrical signal trace routing of the camera module 102. In such cases, the ceramic substrate of the embedded ceramic substrate package overlies the RDL, and the ceramic substrate overlying the RDL is overmolded with the BMC. In some cases, the image sensor of the camera module 102 is electrically connected to the electrical signal trace routing of the RDL.

As further described herein, in some embodiments of the present disclosure, the ceramic substrate of the embedded ceramic substrate package of the camera module 102 includes electrical circuitry on both a first surface of the ceramic substrate and a second surface of the ceramic substrate opposite the first surface.

In some cases, the ceramic substrate of the embedded ceramic substrate package of the camera module 102 may be a single-layer substrate. In other cases, the ceramic substrate of the embedded ceramic substrate package of the camera module 102 may be a multiple-layer substrate. In some cases, when the ceramic substrate is multiple-layer substrate, the multiple-layer substrate may include a plurality of ceramic substrates arranged in a stack, where the plurality of ceramic substrates includes at least a first ceramic substrate and a second ceramic substrate. Further, in such cases, the stack may further include one or more intervening layers between the first ceramic substrate and the second ceramic substrate.

FIGS. 2A through 2E illustrate a first example of a process of forming a package structure including an embedded ceramic substrate by building up from a FPC 200. The process depicted in FIGS. 2A through 2E may be used to form an embedded ceramic substrate package including a single piece of ceramic substrate 202.

Referring to FIG. 2A, the embedded substrate corresponds to a ceramic substrate 202 with double-sided circuits on top and bottom surfaces. In various embodiments, the ceramic substrate 202 may be an HTCC, LTCC, or DPC ceramic. In some cases, alternatives to ceramic materials may also be satisfactory, such as an FR4 PCB substrate, or an MCPCB substrate. The ceramic substrate 202 can be a single-layer substrate or a multiple-layer substrate with a relatively low warpage. FIG. 2A illustrates that, on the "highest" component surface of the ceramic substrate 202, via pad or metal trace, small spacers (identified as first and second photo-imageable spacers 204, 206 in FIG. 2A) may be prepared with photo-imageable polymers, for an accurate definition of an RDL dielectric thickness over each substrate to be embedded. The process includes placing the FPC 200 (also referred to as an "FPC panel") onto a carrier 210 (e.g., a glass/ceramic/stainless carrier) using a thermal/ultraviolet (UV) release tape 212. The process includes bonding the ceramic substrate 202, IC chip(s), SMD(s), onto the FPC 200 by solder or ACA. Optionally, the process may include underfilling the bonded devices and the ceramic substrate 202.

FIG. 2B illustrates that the process of forming the embedded ceramic substrate package includes dispensing or dipping a bulk molding compound (BMC) 220, followed by compression and molding in a vacuum. A thickness of the BMC 220 over the ceramic substrate 202 can be controlled by the spacers 204, 206 with pre-defined thickness. To achieve better control of RDL dielectric thickness, the thickness of a release film on a top mold (not shown in FIG. 2B) used for compression/molding can be adjusted, and the top mold can be modified from global type to individual type.

Referring to FIG. 2C, the embedded ceramic substrate package is illustrated. The process of forming the embedded ceramic substrate package includes cleaning/polishing of the molded surface if necessary followed by laser drilling of vias. FIG. 2C illustrates that the second spacer 206 (see FIGS. 2A and 2B) above the ceramic via pad is burnt off, and the first spacer 204 above the ceramic substrate 202 is buried into the BMC 220. The process further includes laser direct imaging (LDI) scribing metal traces 230, electroless/electro plating Ni/Cu, followed by ENIG/ENEPIG plating of an RDL layer 232. In some cases, if additional layers of RDL are required, the process may be repeated from molding.

Figure 2D:
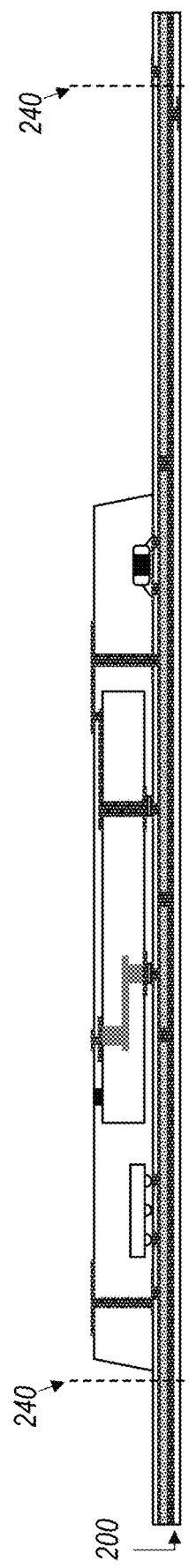
Figure 2E:
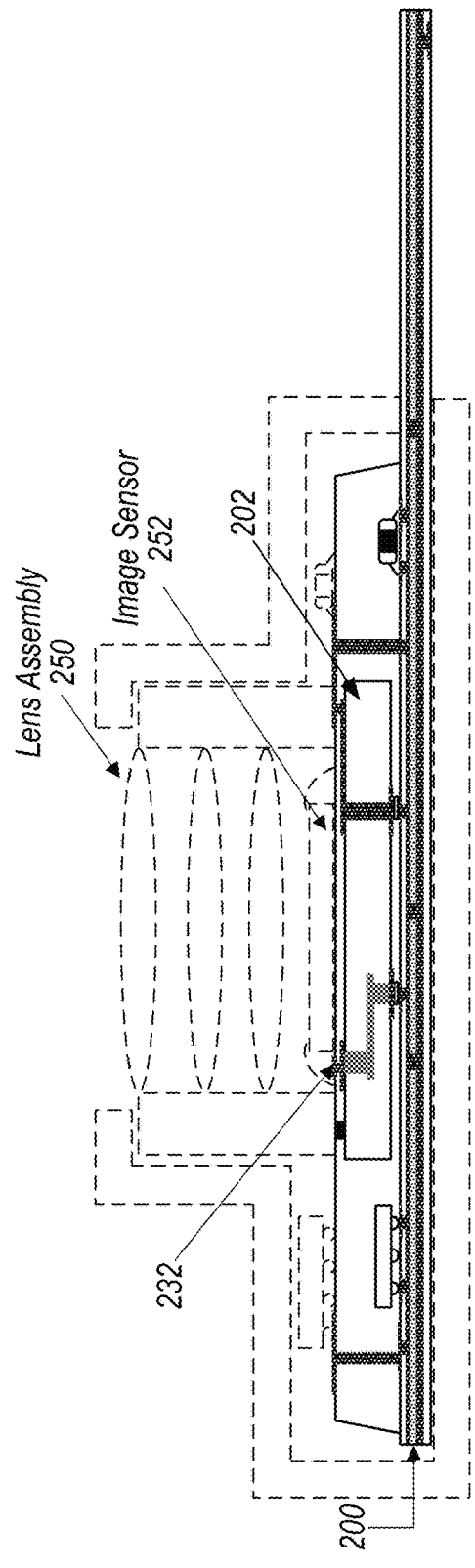

FIG. 2D illustrates subsequent removal of the carrier 210, with the dashed lines 240 indicating locations for singulating the FPC 200. FIG. 2E illustrates the removal of material from the FPC 200 following the singulation. FIG. 2E further illustrates subsequent attachment of SMT, die attach, wire bonds, lens attach, housing attach, etc. FIG. 2E also illustrates that a lens assembly 250 (including an image sensor 252) may be located on top of the thin RDL layer 232 over the ceramic substrate area, which is very stable (with ±1 µm level dimensional shift after reliability tests). In alternative embodiments, lens legs may rest on the locally exposed ceramic substrate. The process depicted in FIGS. 2A through 2E illustrates the elimination of a typical ACF bonding process.

FIGS. 3A through 3C illustrate a second example of a process of forming a package structure including an embedded ceramic substrate by building up from a FPC 300. The process depicted in FIGS. 3A through 3C may be used to form an embedded ceramic substrate package including a stack of two pieces of ceramic substrate, with side-wall connects.

Referring to FIG. 3A, the process may include molding in two layers of ceramic substrate 302, forming RDL layers on top of each of the two layers of the ceramic substrate 302, and forming plated through holes (PTHs) 310. In cases where the top layer of the ceramic substrate 302 is a thin-film DPC substrate, then the associated RDL layer may be omitted, because the line width/space of DPC is relatively fine already. FIG. 3A further illustrates dashed lines 340, indicating locations for singulation of the FPC 300. Note that one location for singulation of the FPC 300 corresponds to an axis of one of the PTHs 308. The other location for singulation of the FPC 300 is similar to the location illustrated in the embodiment depicted in FIG. 2D.

FIG. 3B illustrates the removal of material from the FPC 300 following the singulation, with singulation of the molded substrate through the PTHs 308 to form the electrical connection of DOE in Depth Projector. FIG. 3C is a perspective cross-sectional view 360 designed to show dice through PTH associated with the result of the process depicted in FIGS. 3A and 3B.

FIGS. 4A and 4B illustrate a third example of a process of forming a package structure including an embedded ceramic substrate by building up from a FPC 400. The process depicted in FIGS. 4A and 4B may be used to form an embedded ceramic substrate package including a ceramic substrate frame 401 embedded on a first ceramic substrate 402, with a cavity 403.

Referring to FIG. 4A, the process may include solder bonding the first ceramic substrate 402 onto the FPC 400, filling with underfill, and then soldering the ceramic substrate frame 401 on top of the first ceramic substrate 402. By adding a piece of insert in the upper mold, the cavity 403 may be formed in the ceramic substrate frame 401. Subsequently, RDL layers may be formed on the ceramic substrate frame 401. FIG. 4A further illustrates that the FPC 400 overlies a carrier 410, with dashed lines 440 indicating locations for singulation of the FPC 400. FIG. 4B illustrates the resulting embedded ceramic substrate package following release of the carrier 410 and singulation of the FPC 400 after carrier release.

FIGS. 5A through 5D illustrate a fourth example of a process of forming a package structure including an embedded ceramic substrate by building up from a FPC 500. The process depicted in FIGS. 5A through 5D may be used to form an embedded ceramic substrate package with a cavity 503 and a window 505.

Figure 5A:
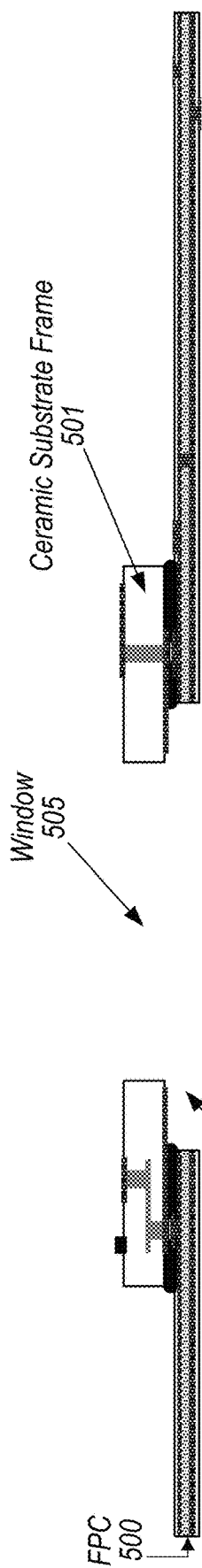
FIGS. 5A through 5D illustrate a fourth example of a process of forming a package structure including an embedded ceramic substrate by building up from a FPC, according to some embodiments.

Referring to FIG. 5A, the process includes attaching a ceramic substrate frame 501 onto the FPC 500 with opening of the cavity 503 by soldering, followed by underfilling.

Figure 5B:
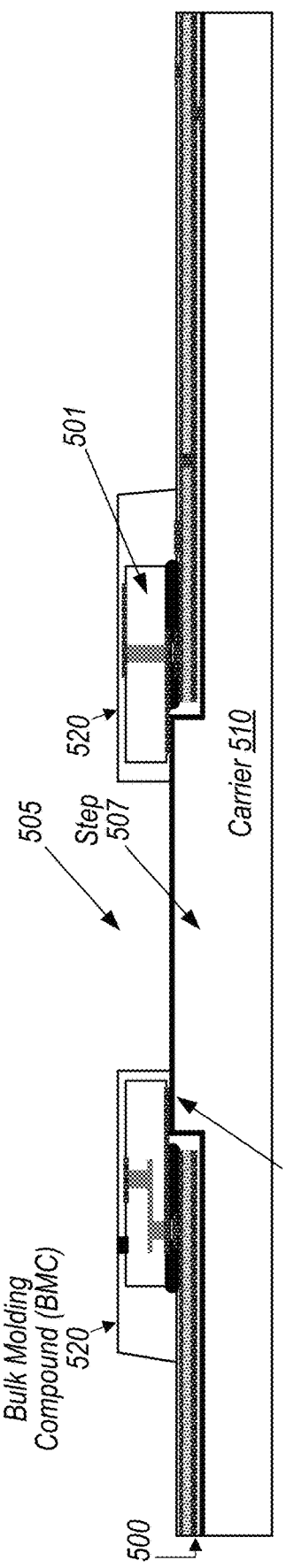

FIG. 5B illustrates that the process includes using a carrier 510 with a step 507 and placing a thermal/UV release tape 512 on the carrier 510. FIG. 5B illustrates subsequent placement of the panel depicted in FIG. 5A onto the carrier 510, so that each bottom pocket of the FPC 500 fits into the step 507 of the carrier 510. A top mold with a local insert (not shown) may be used to contact the step 507 of the carrier 510 so that no BMC 520 is encapsulated in the finally formed window 505. Alternatively, a top mold without a local insert may be used such that no window is formed, and subsequent laser drilling may be used to finally open the window 505.

Figure 5C:
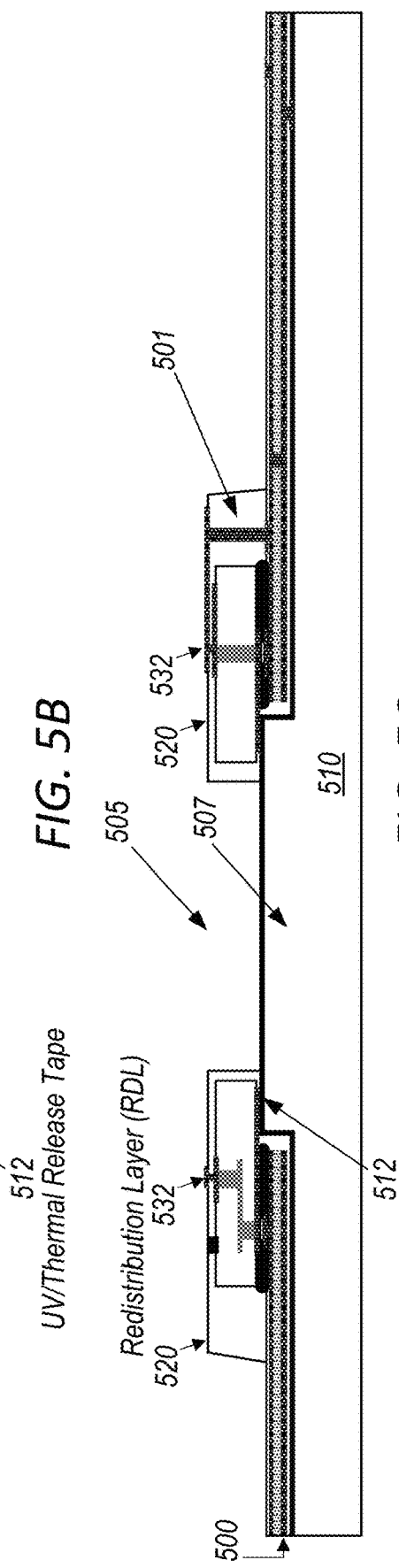
Figure 5D:
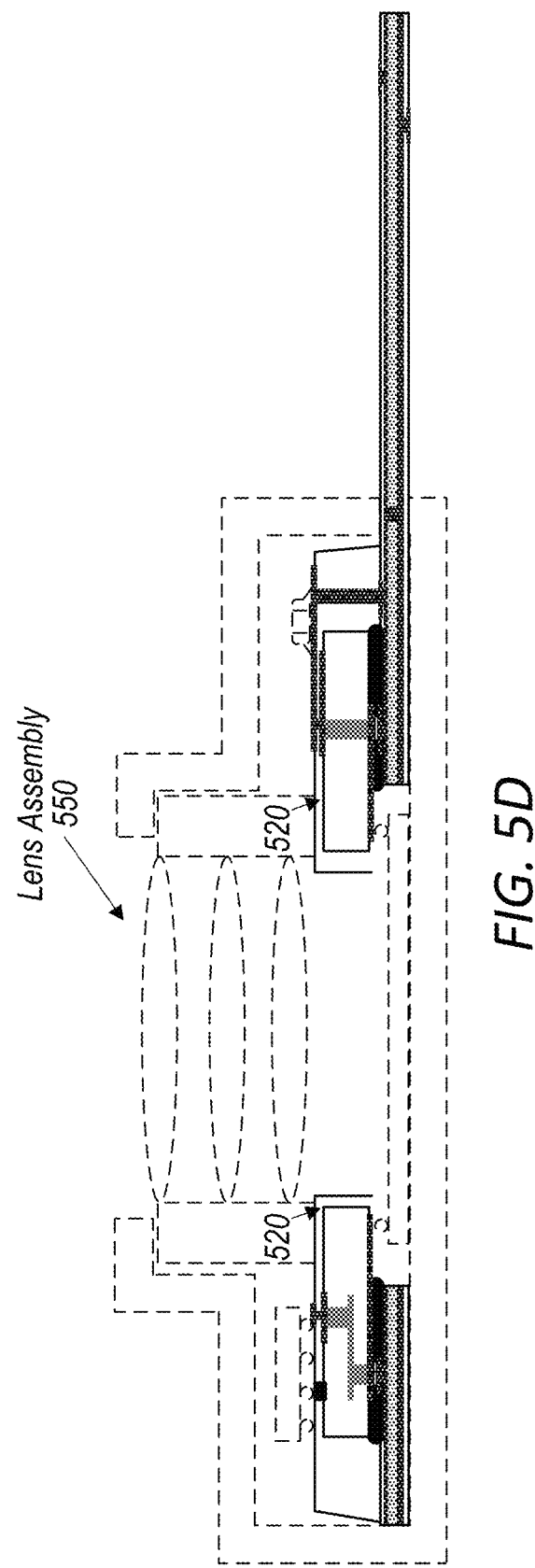

FIG. 5C illustrates that the process includes via drilling and filling, LDI, and Ni/Cu/Au plating to form an RDL 532. FIG. 5D illustrates that the process includes removal of the carrier 510, followed by singulation of the FPC 500 (with dashed lines omitted in FIG. 5C). FIG. 5D further illustrates subsequent attachment of SMT, die attach, wire bonds, lens attach, housing attach, etc. FIG. 5D also illustrates that a lens assembly 550 (include an image sensor) may be located on top of the BMC 520 over the ceramic substrate area, forming a camera module assembly.

FIGS. 6A through 6E illustrate a first example of a process of forming a package structure including an embedded ceramic substrate by building up from a RDL 600. The process depicted in FIGS. 6A through 6E may be used to form an embedded ceramic substrate package including a single piece of ceramic substrate.

Figure 6A:
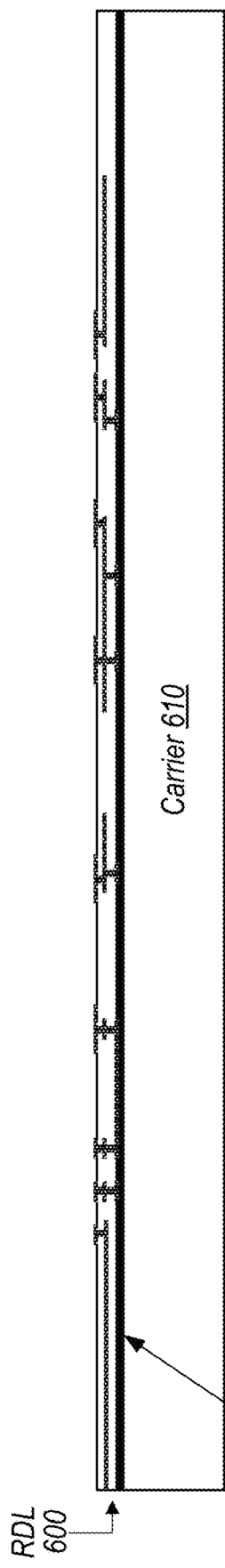
FIGS. 6A through 6E illustrate a first example of a process of forming a package structure including an embedded ceramic substrate by building up from a redistribution layer (RDL), according to some embodiments.

Referring to FIG. 6A, the process includes applying a thermal/UV release tape 612 on a carrier 610 (e.g., a ceramic, glass, or stainless carrier). The process further includes using a dry-film and lithography process (available in a panel-to-panel FPC facility) to form one to two layers of RDL 600 with line width/space of about 5 to 20 μm and a thickness of about 7 to 15 μm.

Figure 6B:
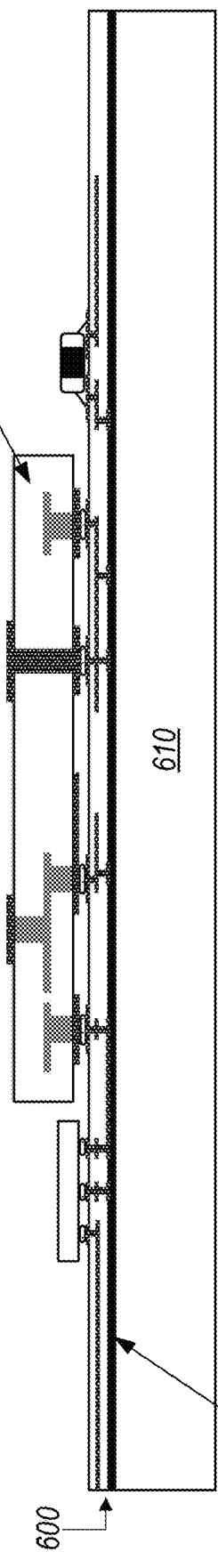

FIG. 6B illustrates that the process includes a smaller size of ceramic substrate 602 for stability-sensitive components only, such as optical chips (e.g., CIS, VCSEL/Driver, APD) and lenses, with a smaller XY dimension helping to increase bending strength and reduce warpage of the ceramic substrate 602. The process includes bonding the IC chips and SMD chips closely to the ceramic substrate 602, for a better signal connection through the RDL 600 and a compact size of the final substrate.

Figure 6C:
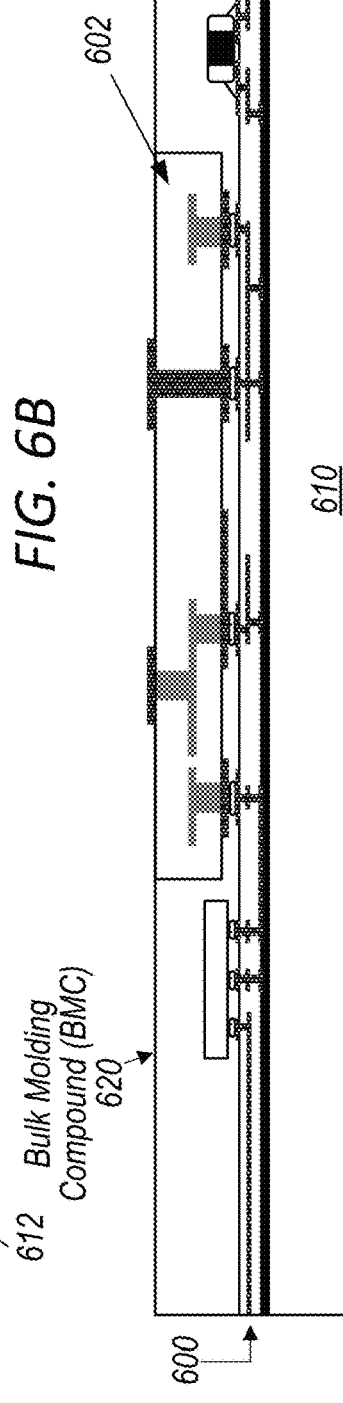
Figure 6D:
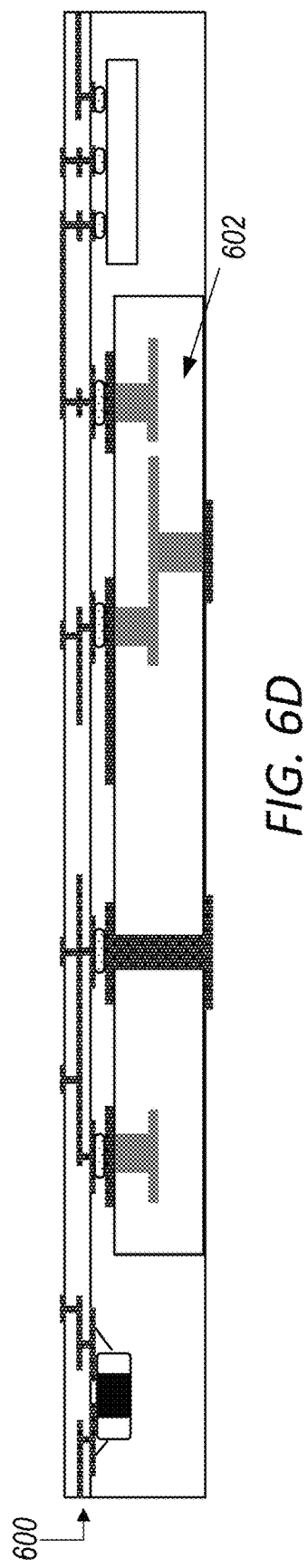

FIG. 6C illustrates that the process includes expose-die molding with BMC 620 for thermal performance. FIG. 6D illustrates that the process includes release of the thermal/UV release tape 612, removal of the carrier 610, and singulation of the panel (with dashed lines omitted in FIG. 6C).

Figure 6E:
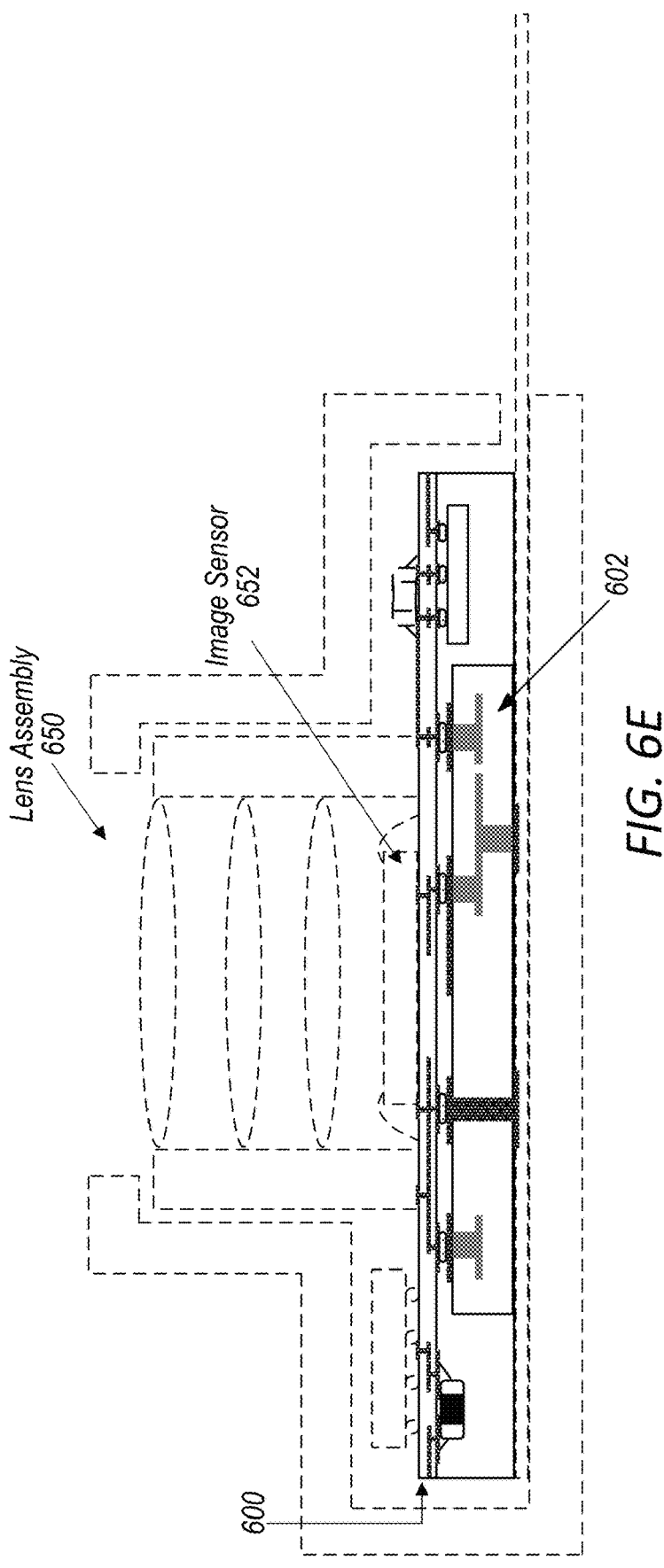

FIG. 6E illustrates that the process includes subsequent attachment of SMT, die attach, wire bonds, lens attach, ACF bonding, housing attach, etc. FIG. 6E also illustrates that a lens assembly 650 (including an image sensor 652) may be located on top of the thin RDL 600 over the ceramic substrate area, which is very stable (with ±1 μm level dimensional shift after reliability tests).

FIGS. 7A through 7C illustrate a second example of a process of forming a package structure including an embedded ceramic substrate by building up from a RDL 700. The process depicted in FIGS. 7A through 7C may be used to form an embedded ceramic substrate package including a stack of two pieces of ceramic substrate 702, with side-wall connects.

FIG. 7A illustrates that, using the exposed die molding process, it is also not difficult to attach another ceramic substrate and mold it in, with FIG. 7A showing the BMC 720. FIG. 7B illustrates that the process may include release of the thermal/UV release tape 712, removal of the carrier 710, and forming PTHs 708 through via drilling and plating. FIG. 7B further illustrates dashed lines 740, indicating locations for singulation of the panel. Note that one location for singulation corresponds to an axis of one of the PTHs 708. The other location for singulation is similar to the location illustrated in the embodiment depicted in FIG. 6D.

FIG. 7C illustrates the selective removal of the BMC 720 from the panel following the singulation, with singulation through the PTHs 708 forming a vertical connection for DOE connector availability in Depth Projector.

FIGS. 8A through 8C illustrate a third example of a process of forming a package structure including an embedded ceramic substrate by building up from a RDL 800. The process depicted in FIGS. 8A through 8C may be used to form an embedded ceramic substrate package including an embedded ceramic substrate frame 801, with a window 805.

Referring to FIG. 8A, the process includes placing a panel of RDL 800 onto a carrier 810 (e.g., a stainless or glass carrier) with a thermal/UV release tape 812. The process further includes attaching a ceramic substrate frame 801 onto the panel of RDL 800 and using exposed-die molding to mold them together, with the top surfaces of the ceramic substrate frame 801 exposed as well as a portion of the RDL layer exposed in a window 805 on the panel of RDL 800.

FIG. 8B illustrates that the process includes laser drilling the portion of the RDL layer that is exposed in the window 805 to remove the exposed portion. FIG. 8B further illustrates release of the thermal/UV release tape 812, removal of the carrier 810, and dicing/singulation of the panel (with dashed lines omitted in FIG. 8B) to remove portions of the BMC 820 and the RDL layer.

FIG. 8C further illustrates a camera module assembly 850, in which critical chips with high-speed signals and high-power consumption attached onto the RDL layer 800 and a housing can be more directly dissipating the heat from these chips. FIG. 8C also illustrates that ACF 851 is attached on the top surface of one side of the ceramic substrate frame 801.

Figure 9:
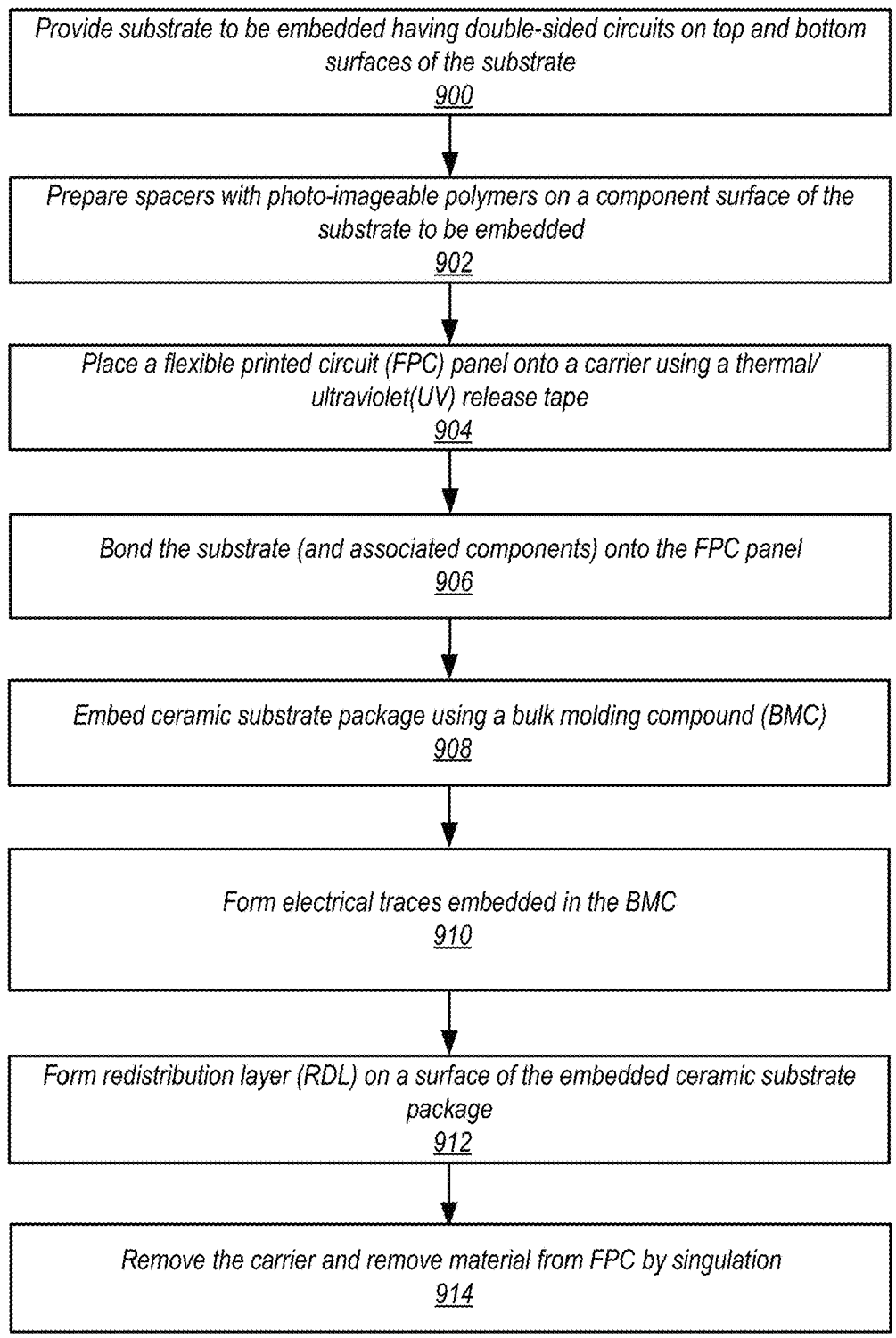
FIG. 9 is a flowchart depicting a first example of a process for forming an embedded ceramic substrate package by building up from a FPC, according to some embodiments.

FIG. 9 is a high-level flowchart of a process for forming an embedded ceramic substrate package by building up from a FPC as illustrated in FIGS. 2A through 2E, according to some embodiments. As indicated at 900, the process includes providing a substrate to be embedded having double-sided circuits on top and bottom surfaces of the substrate. As indicated at 902, the process includes preparing spacers with photo-imageable polymers on a component surface of the substrate to be embedded. For example, referring to FIG. 2A, the spacers 204, 206 may be prepared on a "highest" surface of the substrate, via pad, or metal trace for an accurate definition of RDL dielectric thickness over the ceramic substrate 202 to be embedded. At 904, the process includes placing an FPC panel onto a carrier using a thermal/UV release tape. For example, referring to FIG. 2A, the FPC 200 may be placed onto the carrier 210 using the thermal/UV release tape 212. At 906, the process includes bonding the substrate (and associated components) onto the FPC panel. For example, referring to FIG. 2A, the ceramic substrate 202, IC chip(s), and SMDs may be bonded onto the FPC 200 by solder or ACA. While not shown in FIG. 9, in some embodiments, the process may include underfilling the bonded devices and the substrate.

At 908, the process includes embedding a ceramic substrate package using a BMC. For example, the ceramic substrate package depicted in FIG. 2C may be formed by dispensing or dipping the ceramic substrate package depicted in FIG. 2B in the BMC 220, followed by compression and molding in a vacuum (not shown in FIGS. 2B and 2C).

At 910, the process includes forming electrical traces embedded in the BMC. For example, referring to FIG. 2C, the traces 230 embedded in the BMC 220 may be formed by laser drilling of vias, LDI scribing the traces 230, and electroless/electro plating Ni/Cu. While not shown in FIG. 9, in some embodiments, the process may include cleaning/polishing of the molded surface prior to via formation. Further, while not shown in FIG. 9, the process includes the second spacer 206 above the ceramic via pad being burnt off and the first spacer 204 above the ceramic substrate 202 being buried into the BMC 220 (e.g., as depicted in FIGS. 2B and 2C).

At 912, the process includes forming an RDL layer (or multiple RDL layers) on the embedded ceramic substrate package. For example, referring to FIG. 2C, ENIG/ENEPIG plating may be used to form the RDL layer 232 on a surface of the embedded ceramic substrate 202. In some embodiments, while not shown in FIG. 9, the process may be repeated from molding if additional layers of RDL are required for a particular application.

At 914, the process includes removing the carrier and removing material from the FPC by singulation. For example, FIG. 2D illustrates removal of the carrier 710, and FIG. 2E illustrates the selective removal of material from the FPC 200 by singulation.

Figure 10:
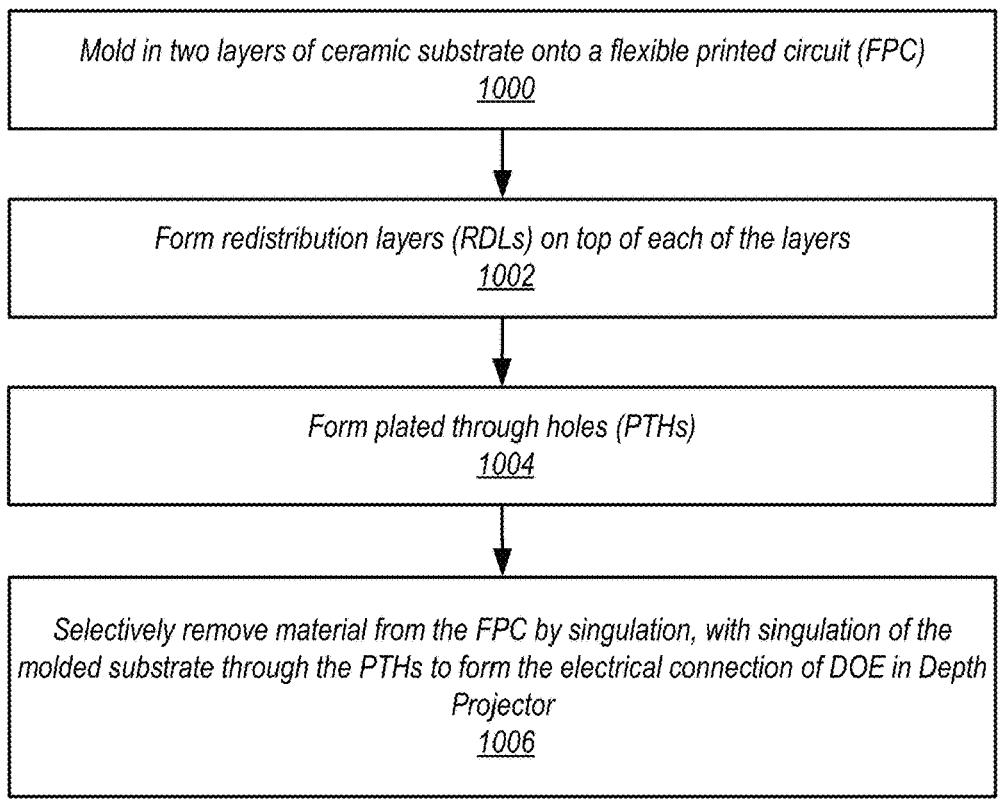
FIG. 10 is a flowchart depicting a second example of a process for forming an embedded ceramic substrate package by building up from a FPC, according to some embodiments.

FIG. 10 is a high-level flowchart of a process for forming an embedded ceramic substrate package by building up from a FPC as illustrated in FIGS. 3A through 3C, according to some embodiments. As indicated at 1000, the process includes molding in two layers of ceramic substrate onto an FPC. At 1002, the process includes forming RDLs on top of each of the layers. At 1004, the process includes forming PTHs. For example, FIG. 3A illustrates molding in two layers of ceramic substrate 302, forming RDL layers on top of each of the two layers of the ceramic substrate 302, and forming PTHs 310.

As indicated at 1006, the process includes selectively removing material from the FPC by singulation, with singulation of the molded substrate through the PTHs 308 to form the electrical connection of DOE in Depth Projector. For example, FIG. 3B illustrates the removal of material from the FPC 300 following the singulation, with singulation of the molded substrate through the PTHs 308 to form the electrical connection of DOE in Depth Projector. FIG. 3C is a perspective cross-sectional view 360 designed to show dice through PTH associated with the result of the process depicted in FIGS. 3A and 3B.

Figure 11:
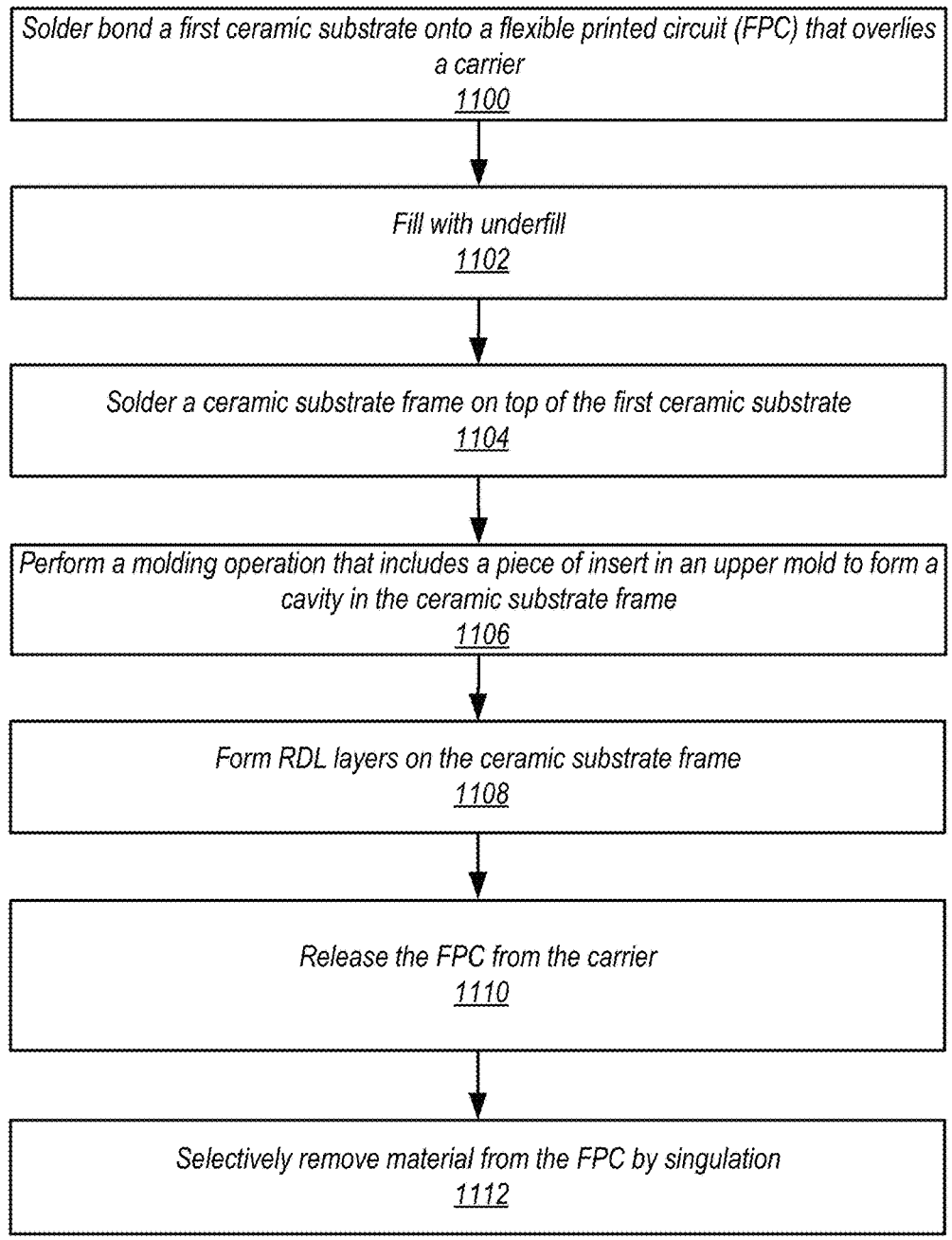
FIG. 11 is a flowchart depicting a third example of a process for forming an embedded ceramic substrate package by building up from a FPC, according to some embodiments.

FIG. 11 is a high-level flowchart of a process for forming an embedded ceramic substrate package by building up from a FPC as illustrated in FIGS. 4A and 4B, according to some embodiments. As indicated at 1100, the process includes solder bonding a first ceramic substrate onto an FPC. As indicated at 1102, the process includes filling with underfill. At 1104, the process includes soldering a ceramic substrate frame on top of the first ceramic substrate. At 1106, the process includes performing a molding operation that includes a piece of insert in an upper mold to form a cavity in the ceramic substrate frame. As indicated at 1108, subsequently the process includes forming RDL layers on the ceramic substrate frame. For example, FIG. 4A illustrates an example of a process that includes solder bonding the first ceramic substrate 402 onto the FPC 400, filling with underfill, and then soldering the ceramic substrate frame 401 on top of the first ceramic substrate 402. By adding a piece of insert in the upper mold, the cavity 403 may be formed in the ceramic substrate frame 401. Subsequently, RDL layers may be formed on the ceramic substrate frame 401.

As indicated at 1110, the process includes releasing the FPC from the carrier. At 1112, the process includes selectively removing material from the FPC by singulation. For example, FIG. 4A illustrates that the FPC 400 overlies a carrier 410, with dashed lines 440 indicating locations for singulation of the FPC 400. FIG. 4B illustrates the resulting embedded ceramic substrate package following release of the carrier 410 and singulation of the FPC 400 after carrier release.

Figure 12:
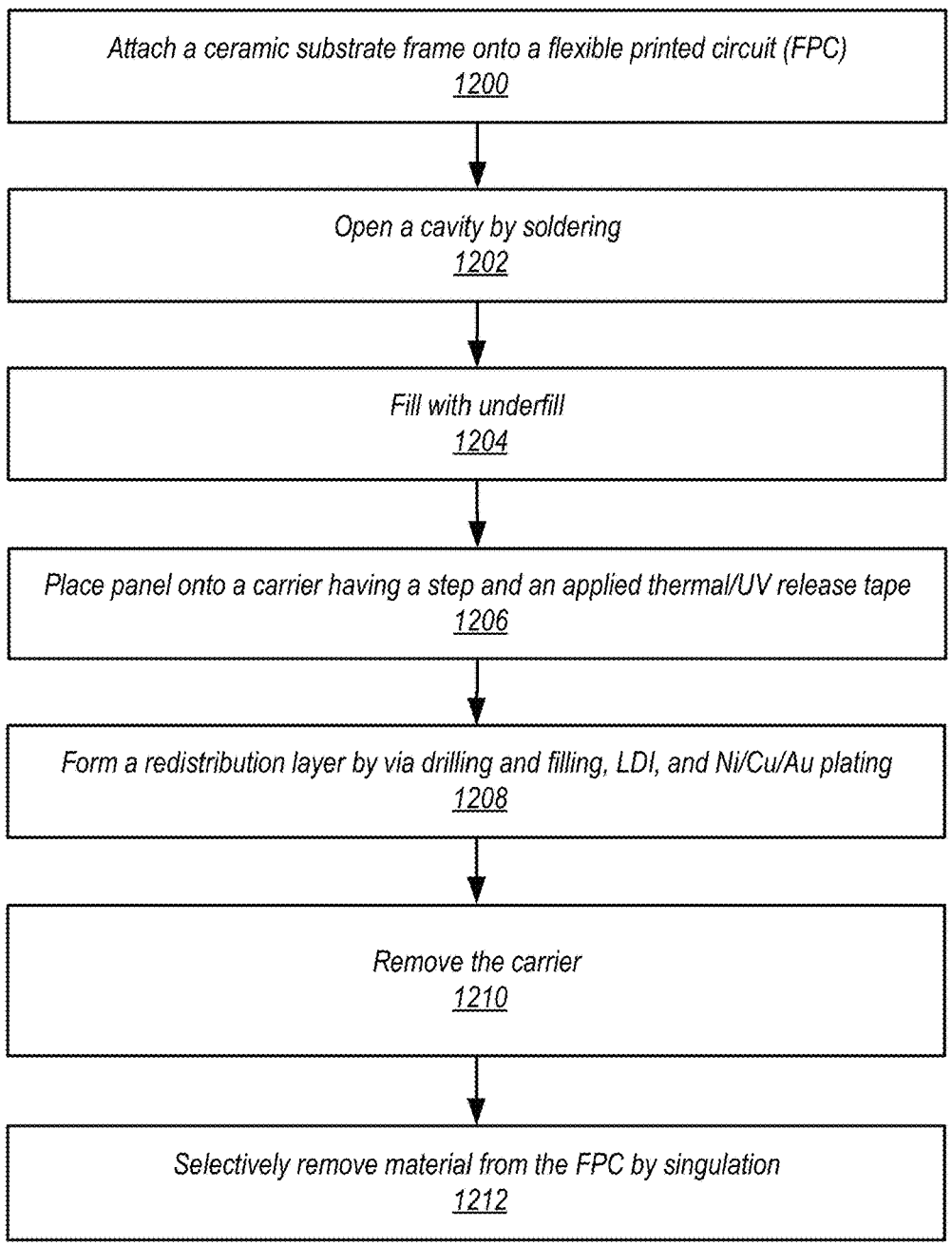
FIG. 12 is a flowchart depicting a fourth example of a process for forming an embedded ceramic substrate package by building up from a FPC, according to some embodiments.

FIG. 12 is a high-level flowchart of a process for forming an embedded ceramic substrate package by building up from a FPC as illustrated in FIGS. 5A through 5D, according to some embodiments. As indicated at 1200, the process includes attaching a ceramic substrate frame onto a FPC. At 1202, the process includes opening a cavity by soldering. At 1204, the process includes filling with underfill. For example, FIG. 5A depicts an example of a process that includes attaching a ceramic substrate frame 501 onto the FPC 500 with opening of the cavity 503 by soldering, followed by underfilling.

As indicated at 1206, the process includes placing the panel onto a carrier having a step and an applied thermal/UV release tape. For example, FIG. 5B illustrates an example of a process that includes using the carrier 510 with the step 507 and placing the thermal/UV release tape 512 on the carrier 510. FIG. 5B illustrates subsequent placement of the panel depicted in FIG. 5A onto the carrier 510, so that each bottom pocket of the FPC 500 fits into the step 507 of the carrier 510. A top mold with a local insert (not shown) may be used to contact the step 507 of the carrier 510 so that no BMC 520 is encapsulated in the finally formed window 505. Alternatively, a top mold without a local insert may be used such that no window is formed, and subsequent laser drilling may be used to finally open the window 505.

As indicated at 1208, the process includes forming a RDL by via drilling and filling, LDI, and Ni/Cu/Au plating. For example, FIG. 5C illustrates an example of a process that includes via drilling and filling, LDI, and Ni/Cu/Au plating to form the RDL 532.

As indicated at 1210, the process includes removing the carrier. At 1212, the process includes selectively removing material from the FPC by singulation. For example, FIG. 5D illustrates an example of a process that includes removal of the carrier 510, followed by singulation of the FPC 500 (with dashed lines omitted in FIG. 5C).

Figure 13:
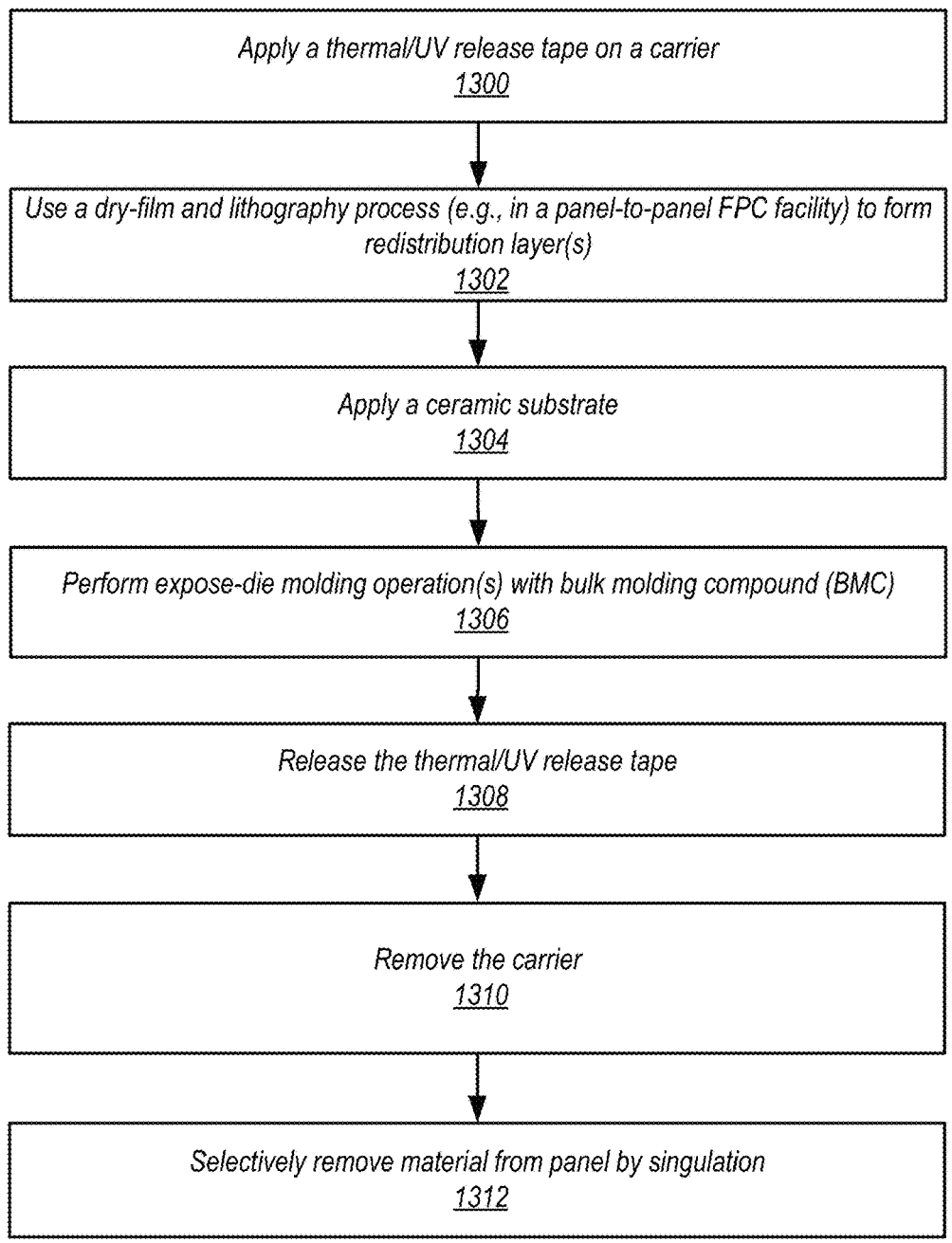
FIG. 13 is a flowchart depicting a first example of a process for forming an embedded ceramic substrate package by building up from a RDL, according to some embodiments.

FIG. 13 is a high-level flowchart of a process for forming an embedded ceramic substrate package by building up from a RDL as illustrated in FIGS. 6A through 6E, according to some embodiments. As indicated at 1300, the process includes applying a thermal/UV release tape on a carrier. At 1302, the process includes using a dry-film and lithography process to form RDL(s). For example, FIG. 6A illustrates an example of a process that includes applying a thermal/UV release tape 612 on a carrier 610 (e.g., a ceramic, glass, or stainless carrier). The process further includes using a dry-film and lithography process (available in a panel-to-panel FPC facility) to form one to two layers of RDL 600 with line width/space of about 5 to 20 μm and a thickness of about 7 to 15 μm.

As indicated at 1304, the process includes applying a ceramic substrate. For example, FIG. 6B illustrates an example of a process that includes a smaller size of ceramic substrate 602 for stability-sensitive components only, such as optical chips (e.g., CIS, VCSEL/Driver, APD) and lenses, with a smaller XY dimension helping to increase bending strength and reduce warpage of the ceramic substrate 602. The process includes bonding the IC chips and SMD chips closely to the ceramic substrate 602, for a better signal connection through the RDL 600 and a compact size of the final substrate.

As indicated at 1306, the process includes performing expose-die molding operation(s) with BMC. As indicated at 1308, the process includes releasing the thermal/UV release tape. At 1310, the process includes removing the carrier. At 1312, the process includes selectively removing material from the panel by singulation. For example, FIG. 6C illustrates an example of a process that includes expose-die molding with BMC 620 for thermal performance, and FIG. 6D illustrates that the process includes release of the thermal/UV release tape 612, removal of the carrier 610, and singulation of the panel (with dashed lines omitted in FIG. 6C).

Figure 14:
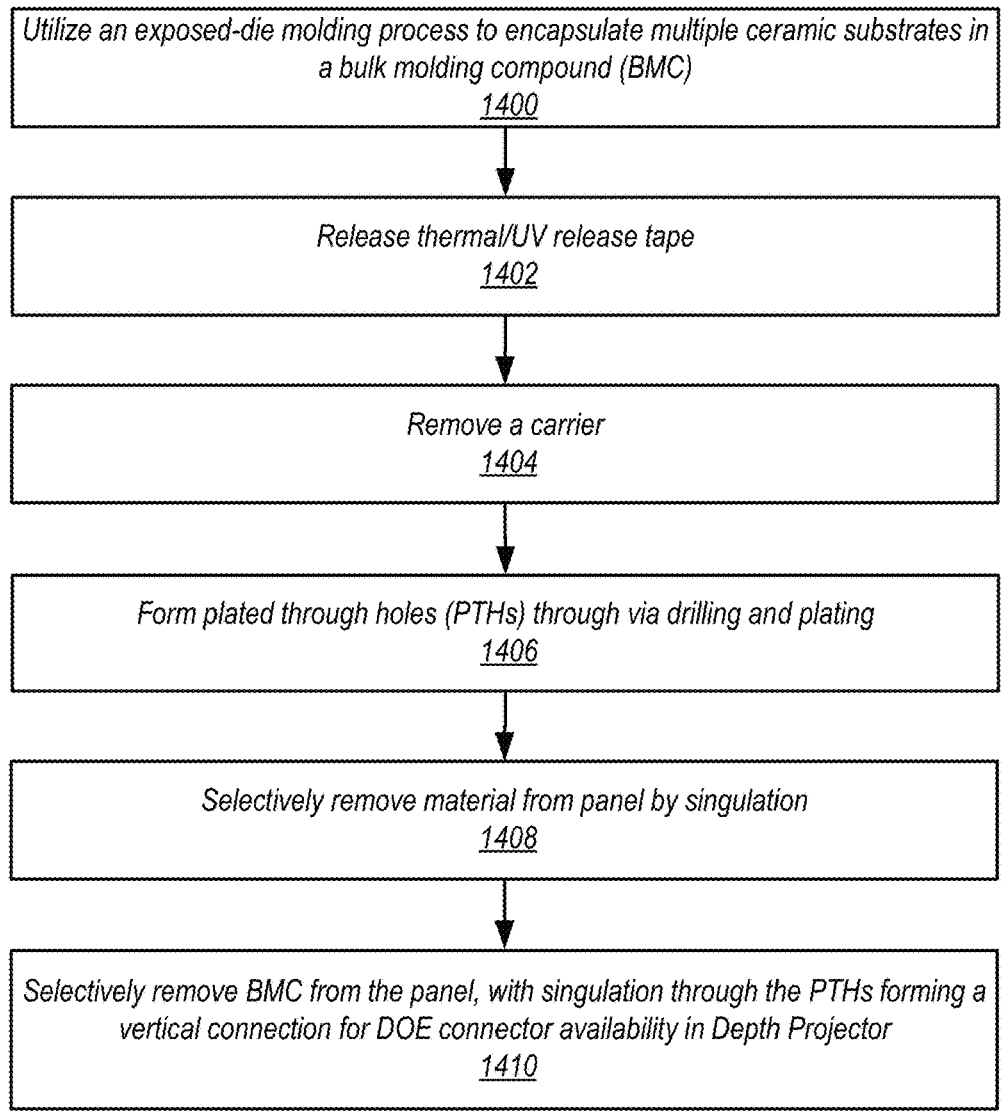
FIG. 14 is a flowchart depicting a second example of a process for forming an embedded ceramic substrate package by building up from a RDL, according to some embodiments.

FIG. 14 is a high-level flowchart of a process for forming an embedded ceramic substrate package by building up from a RDL as illustrated in FIGS. 7A through 7C, according to some embodiments. As indicated at 1400, the process includes utilizing an exposed-die molding process to encapsulate multiple ceramic substrates in a BMC. For example, FIG. 7A illustrates that, using the exposed die molding process, it is also not difficult to attach another ceramic substrate and mold it in, with FIG. 7A showing the BMC 720.

As indicated at 1402, the process includes releasing a thermal/UV release tape. At 1404, the process includes removing a carrier. At 1406, the process includes forming PTHs through via drilling and plating. For example, FIG. 7B illustrates an example of a process that includes release of the thermal/UV release tape 712, removal of the carrier 710, and forming PTHs 708 through via drilling and plating.

As indicated at 1408, the process includes selectively removing material from the panel by singulation. As indicated at 1410, following the singulation, the process includes selectively removing BMC material from the panel. Singulation through the PTHs forms a vertical connection for DOE connector availability in Depth Projector. For example, FIG. 7B illustrates dashed lines 740, indicating locations for singulation of the panel, in which one location for singulation corresponds to an axis of one of the PTHs 708. FIG. 7C illustrates the selective removal of the BMC 720 from the panel following the singulation, with singulation through the PTHs 708 forming a vertical connection for DOE connector availability in Depth Projector.

Figure 15:
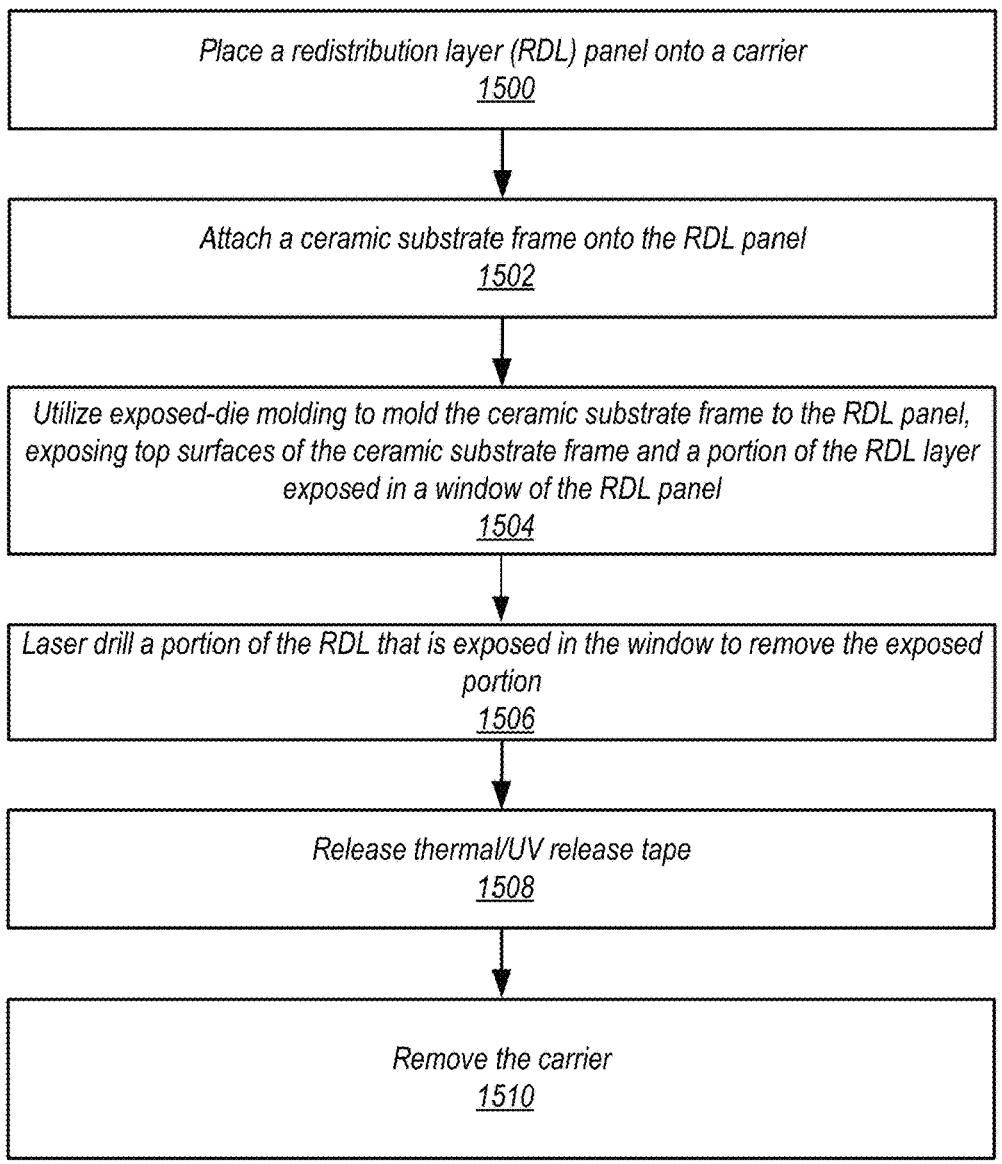
FIG. 15 is a flowchart depicting a third example of a process for forming an embedded ceramic substrate package by building up from a RDL, according to some embodiments.

FIG. 15 is a high-level flowchart of a process for forming an embedded ceramic substrate package by building up from a RDL as illustrated in FIGS. 8A through 8C, according to some embodiments. As indicated at 1500, the process includes placing a RDL panel onto a carrier. At 1502, the process includes attaching a ceramic substrate frame onto the RDL panel. At 1504, the process includes utilizing exposed-die molding to mold the ceramic substrate frame to the RDL panel. For example, FIG. 8A illustrates an example of a process that includes placing a panel of RDL 800 onto a carrier 810 (e.g., a stainless or glass carrier) with a thermal/UV release tape 812. FIG. 8A further illustrates attaching a ceramic substrate frame 801 onto the panel of RDL 800 and using exposed-die molding to mold them together, with the top surfaces of the ceramic substrate frame 801 exposed as well as a portion of the RDL layer exposed in a window 805 on the panel of RDL 800.

As indicated at 1506, the process includes laser drilling a portion of the RDL that is exposed in the window to remove the exposed portion. At 1508, the process includes releasing thermal/UV release tape. At 1510, the process includes removing the carrier. For example, FIG. 8B illustrates an example of a process that includes laser drilling the portion of the RDL layer that is exposed in the window 805 to remove the exposed portion. FIG. 8B further illustrates release of the thermal/UV release tape 812, removal of the carrier 810, and dicing/singulation of the panel (with dashed lines omitted in FIG. 8B) to remove portions of the BMC 820 and the RDL layer.

Multifunction Device Examples

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use one or more common physical user-interface devices, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 16A:
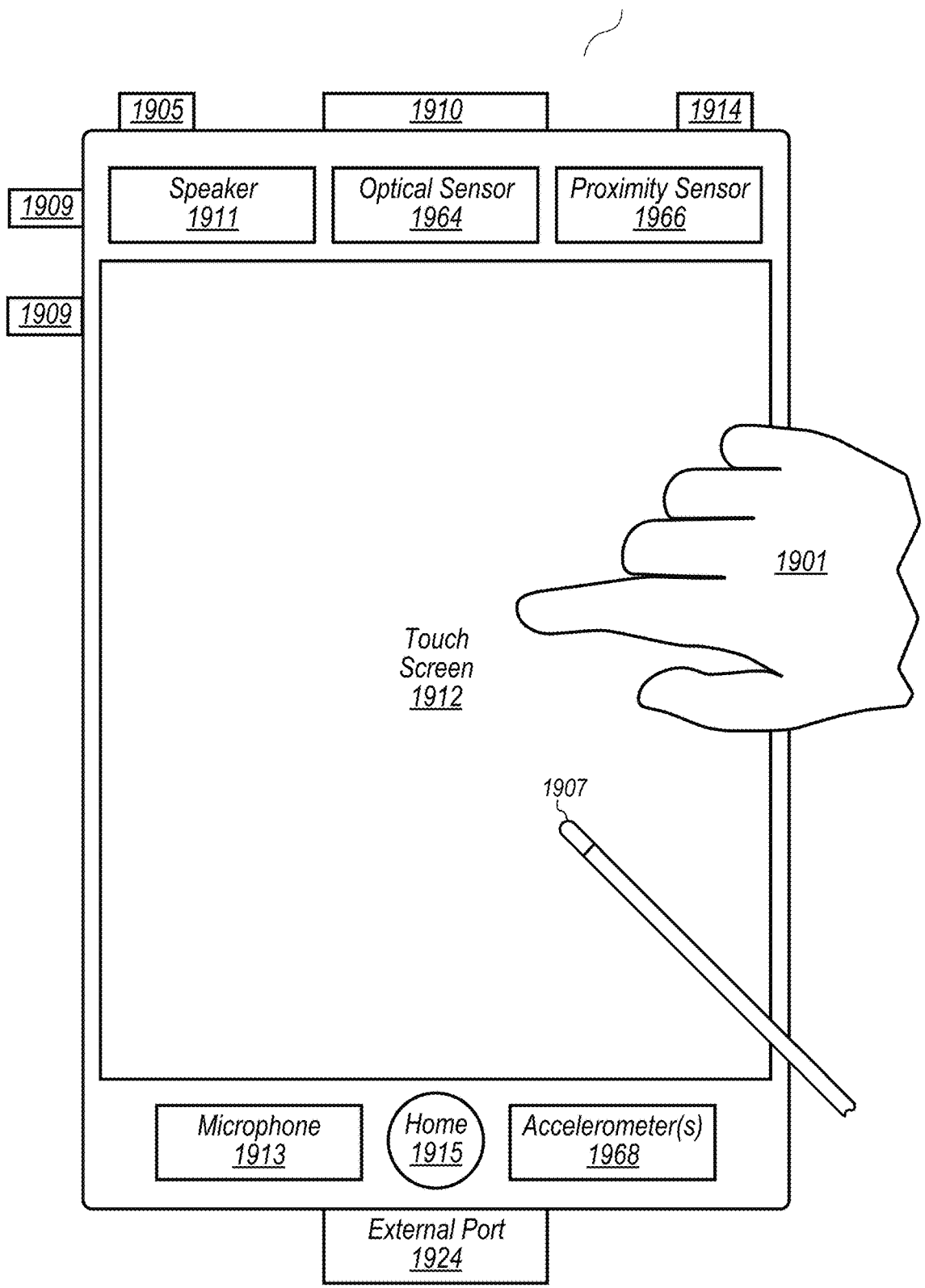
FIGS. 16A through 16C illustrate a mobile device with a camera module having an embedded ceramic substrate package attached to an image sensor, according to some embodiments.
Figure 16B:
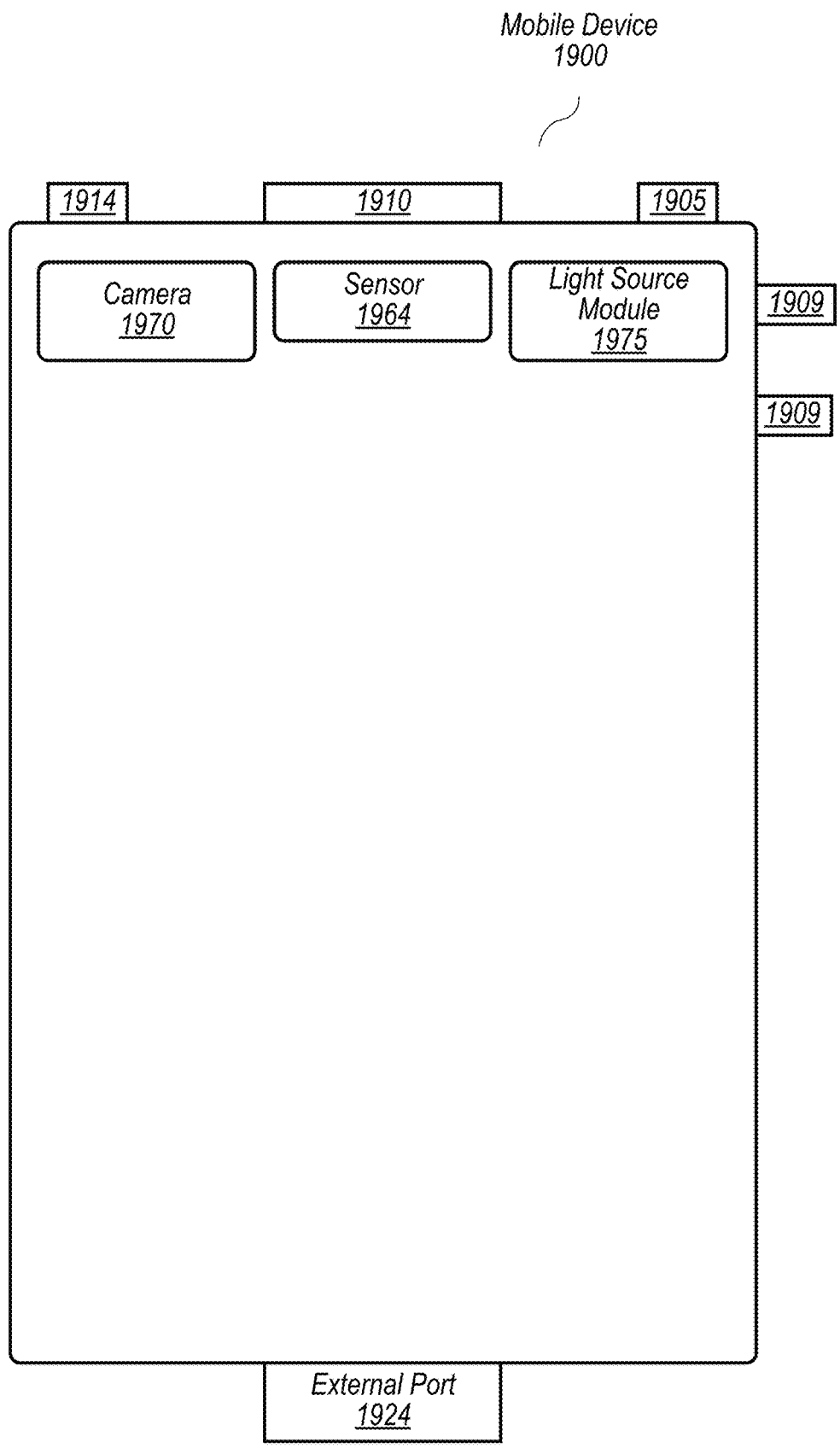
Figure 16C:
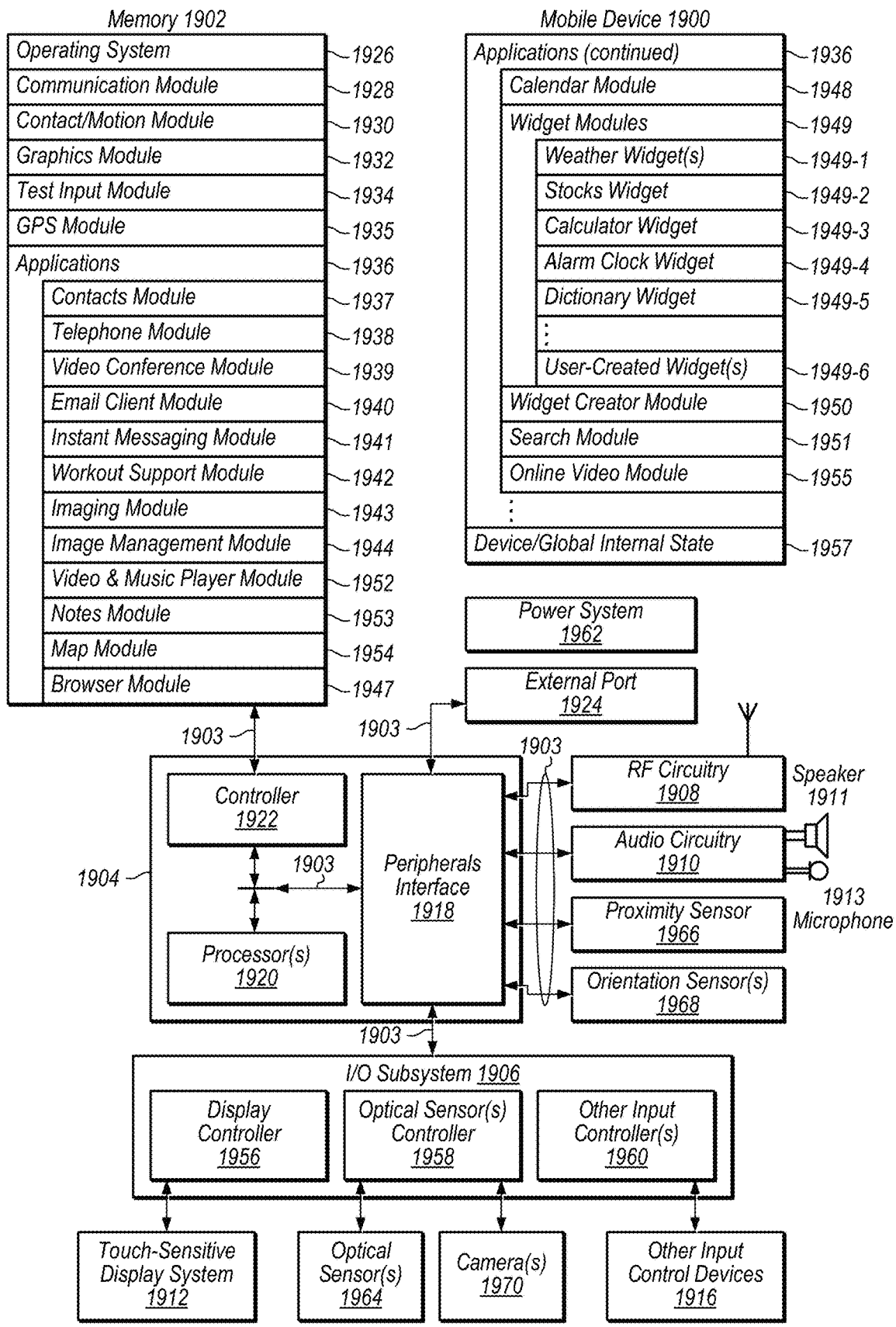

FIG. 16A through 16C illustrate a mobile device 1900 that may include one or more camera modules, in accordance with embodiments as described above. In some embodiments, the device 1900 may include one or multiple features, components, and/or functionality of embodiments described herein.

FIG. 16A illustrates that a "front" side of the device 1900 may have a touch screen 1912. The touch screen 1912 may display one or more graphics within user interface (UI) 1900. In this embodiment, as well as others described below, a user may select one or more of the graphics by making a gesture on the graphics, for example, with one or more fingers 1901 (not drawn to scale in the figure) or one or more styluses 1907 (not drawn to scale in the figure).

Device 1900 may also include one or more physical buttons, such as "home" or menu button 1915, which may be used to navigate to any application 1936 (see FIG. 16C) in a set of applications that may be executed on device 1900. Alternatively, in some embodiments, the menu button is implemented as a soft key in a graphics user interface (GUI) displayed on touch screen 1912.

In one embodiment, device 1900 includes touch screen 1912, menu button 1915, push button 1905 for powering the device on/off and locking the device, volume adjustment button(s) 1909, Subscriber Identity Module (SIM) card slot 1910, head set jack 1914, and docking/charging external port 1924. Push button 1905 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 1900 also may accept verbal input for activation or deactivation of some functions through microphone 1913.

FIG. 16B illustrates that a "rear" side of the device 1900 may include a camera 1970, in accordance with some embodiments. The camera 1970, which is sometimes called an "optical sensor" for convenience, may also be known as or called an optical sensor system. The camera 1970 includes one or more camera modules, including at least one of the camera modules described herein. FIG. 16B further illustrates sensor 1964 and light source module 1975.

Referring to FIG. 16C, a block diagram illustrates that device 1900 may include memory 1902 (which may include one or more computer readable storage mediums), memory controller 1922, one or more processing units (CPU's) 1920, peripherals interface 1918, RF circuitry 1908, audio circuitry 1910, speaker 1911, touch-sensitive display system 1912, microphone 1913, input/output (I/O) subsystem 1906, other input control devices 1916, and external port 1924. Device 1900 may include one or more optical sensors 1964. These components may communicate over one or more communication buses or signal lines 1903.

It should be appreciated that device 1900 is only one example of a portable multifunction device, and that device 1900 may have more or fewer components than shown, may combine two or more components, or may have a different configuration or arrangement of the components. The various components shown in FIG. 16C may be implemented in hardware, software, or a combination of hardware and software, including one or more signal processing and/or application specific integrated circuits.

Memory 1902 may include high-speed random access memory and may also include non-volatile memory, such as one or more magnetic disk storage devices, flash memory devices, or other non-volatile solid-state memory devices. Access to memory 1902 by other components of device 1900, such as CPU 1920 and the peripherals interface 1918, may be controlled by memory controller 1922.

Peripherals interface 1918 can be used to couple input and output peripherals of the device to CPU 1920 and memory 1902. The one or more processors 1920 run or execute various software programs and/or sets of instructions stored in memory 1902 to perform various functions for device 1900 and to process data.

In some embodiments, peripherals interface 1918, CPU 1920, and memory controller 1922 may be implemented on a single chip, such as chip 1904. In some other embodiments, they may be implemented on separate chips.

RF (radio frequency) circuitry 1908 receives and sends RF signals, also called electromagnetic signals. RF circuitry 1908 converts electrical signals to/from electromagnetic signals and communicates with communications networks and other communications devices via the electromagnetic signals. RF circuitry 1908 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 1908 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 1910, speaker 1911, and microphone 1913 provide an audio interface between a user and device 1900. Audio circuitry 1910 receives audio data from peripherals interface 1918, converts the audio data to an electrical signal, and transmits the electrical signal to speaker 1911. Speaker 1911 converts the electrical signal to human-audible sound waves. Audio circuitry 1910 also receives electrical signals converted by microphone 1913 from sound waves. Audio circuitry 1910 converts the electrical signal to audio data and transmits the audio data to peripherals interface 1918 for processing. Audio data may be retrieved from and/or transmitted to memory 102 and/or RF circuitry 1908 by peripherals interface 1918. In some embodiments, audio circuitry 1910 also includes a headset jack (e.g., 1914, FIGS. 16A-B). The headset jack provides an interface between audio circuitry 1910 and removable audio input/output peripherals, such as output-only headphones or a headset with both output (e.g., a headphone for one or both ears) and input (e.g., a microphone).

I/O subsystem 1906 couples input/output peripherals on device 1900, such as touch screen 1912 and other input control devices 1916, to peripherals interface 1918. I/O subsystem 1906 may include display controller 1956 and one or more input controllers 1960 for other input or control devices. The one or more input controllers 1916 receive/send electrical signals from/to other input or control devices 1916. The other input control devices 1916 may include physical buttons (e.g., push buttons, rocker buttons, etc.), dials, slider switches, joysticks, click wheels, and so forth. In some alternative embodiments, input controller(s) 1960 may be coupled to any (or none) of the following: a keyboard, infrared port, USB port, and a pointer device such as a mouse. The one or more buttons (e.g., 1909, FIGS. 16A-16B) may include an up/down button for volume control of speaker 1911 and/or microphone 1913. The one or more buttons may include a push button (e.g., 1906, FIGS. 16A-B).

Touch-sensitive display 1912 provides an input interface and an output interface between the device and a user. Display controller 1956 receives and/or sends electrical signals from/to touch screen 1912. Touch screen 1912 displays visual output to the user. The visual output may include graphics, text, icons, video, and any combination thereof (collectively termed "graphics"). In some embodiments, some or all of the visual output may correspond to user-interface objects.

Touch screen 1912 has a touch-sensitive surface, sensor or set of sensors that accepts input from the user based on haptic and/or tactile contact. Touch screen 1912 and display controller 1956 (along with any associated modules and/or sets of instructions in memory 1902) detect contact (and any movement or breaking of the contact) on touch screen 1912 and converts the detected contact into interaction with user-interface objects (e.g., one or more soft keys, icons, web pages or images) that are displayed on touch screen 1912. In an example embodiment, a point of contact between touch screen 1912 and the user corresponds to a finger of the user.

Touch screen 1912 may use LCD (liquid crystal display) technology, LPD (light emitting polymer display) technology, or LED (light emitting diode) technology, although other display technologies may be used in other embodiments. Touch screen 1912 and display controller 1956 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 1912. In an example embodiment, projected mutual capacitance sensing technology may be used.

Touch screen 1912 may have a video resolution in excess of 100 dots per inch (dpi). In some embodiments, the touch screen has a video resolution of approximately 160 dpi. The user may make contact with touch screen 1912 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 1900 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 1912 or an extension of the touch-sensitive surface formed by the touch screen.

Device 1900 also includes power system 1962 for powering the various components. Power system 1962 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 1900 may also include one or more optical sensors 1964 and one or more cameras 1970. FIG. 16C shows an optical sensor coupled to optical sensor controller 1958 in I/O subsystem 1906. Optical sensor 1964 may include charge-coupled device (CCD) or complementary metal-oxide semiconductor (CMOS) phototransistors. Optical sensor 1964 receives light from the environment, projected through one or more lens, and converts the light to data representing an image. In conjunction with camera(s) 1970 (such as an embodiment of a camera module described herein), optical sensor 1964 may capture still images or video. In some embodiments, an optical sensor is located on the back of device 1900, opposite touch screen display 1912 on the front of the device, so that the touch screen display may be used as a viewfinder for still and/or video image acquisition. In some embodiments, another optical sensor is located on the front of the device so that the user's image may be obtained for videoconferencing while the user views the other videoconference participants on the touch screen display.

Device 1900 may also include one or more proximity sensors 1966. FIG. 16C shows proximity sensor 1966 coupled to peripherals interface 1918. Alternatively, proximity sensor 1966 may be coupled to input controller 1960 in I/O subsystem 1906. In some embodiments, the proximity sensor turns off and disables touch screen 1912 when the multifunction device is placed near the user's ear (e.g., when the user is making a phone call).

Device 1900 includes one or more orientation sensors 1968. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 1900. In some embodiments, the one or more orientation sensors include any combination of orientation/rotation sensors. FIG. 19C shows the one or more orientation sensors 1968 coupled to peripherals interface 1918. Alternatively, the one or more orientation sensors 1968 may be coupled to an input controller 1960 in I/O subsystem 1906. In some embodiments, information is displayed on the touch screen display in a portrait view or a landscape view based on an analysis of data received from the one or more orientation sensors.

In some embodiments, the software components stored in memory 1902 include operating system 1926, communication module (or set of instructions) 1928, instructions). Furthermore, in some embodiments, memory 1902 stores device/global internal state, including information obtained from the device's various sensors and input control devices 1916; and location information concerning the device's location and/or attitude.

Operating system 1926 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 1928 facilitates communication with other devices over one or more external ports 1924 and also includes various software components for handling data received by RF circuitry 1908 and/or external port 1924. External port 1924 (e.g., Universal Serial Bus (USB), FIREWIRE, etc.) is adapted for coupling directly to other devices or indirectly over a network (e.g., the Internet, wireless LAN, etc.).

Contact/motion module 1930 may detect contact with touch screen 1912 (in conjunction with display controller 1956) and other touch sensitive devices (e.g., a touchpad or physical click wheel). Contact/motion module 1930 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 1930 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 1930 and display controller 1956 detect contact on a touchpad.

Contact/motion module 1930 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 1932 includes various known software components for rendering and displaying graphics on touch screen 1912 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 1932 stores data representing graphics to be used. Each graphic may be assigned a corresponding code. Graphics module 1932 receives, from applications etc., one or more codes specifying graphics to be displayed along with, if necessary, coordinate data and other graphic property data, and then generates screen image data to output to display controller 1956.

Text input module 1934, which may be a component of graphics module 1932, provides soft keyboards for entering text in various applications (e.g., contacts 1937, e-mail 1940, IM 1941, browser 1947, and any other application that needs text input).

GPS module 1935 determines the location of the device and provides this information for use in various applications (e.g., to telephone 1938 for use in location-based dialing, to imaging module 1943 as picture/video metadata, and to applications that provide location-based services such as weather widgets, local yellow page widgets, and map/navigation widgets).

Applications 1936 may include the following modules (or sets of instructions), or a subset or superset thereof:
- contacts module 1937 (sometimes called an address book or contact list);
- telephone module 1938;
- video conferencing module 1939;
- e-mail client module 1940;
- instant messaging (IM) module 1941;
- workout support module 1942;
- camera module 1943 for still and/or video images;
- image management module 1944;
- browser module 1947;
- calendar module 1948;
- widget modules 1949, which may include one or more of: weather widget 1949-1, stocks widget 1949-2, calculator widget 1949-3, alarm clock widget 1949-4, dictionary widget 1949-5, and other widgets obtained by the user, as well as user-created widgets 1949-6;

widget creator module 1950 for making user-created widgets 1949-6;

search module 1951;

video and music player module 1952, which may be made up of a video player module and a music player module;

notes module 1953;

map module 1954; and/or online video module 1955.

Examples of other applications 1936 that may be stored in memory 1902 include other word processing applications, other image editing applications, drawing applications, presentation applications, JAVA-enabled applications, encryption, digital rights management, voice recognition, and voice replication.

In conjunction with touch screen 1912, display controller 1956, contact module 1930, graphics module 1932, and text input module 1934, contacts module 1937 may be used to manage an address book or contact list, including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 1938, video conference 1939, e-mail 1940, or IM 1941; and so forth.

In conjunction with RF circuitry 1908, audio circuitry 1910, speaker 1911, microphone 1913, touch screen 1912, display controller 1956, contact module 1930, graphics module 1932, and text input module 1934, telephone module 1938 may be used to enter a sequence of characters corresponding to a telephone number, access one or more telephone numbers in address book 1937, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 1908, audio circuitry 1910, speaker 1911, microphone 1913, touch screen 1912, display controller 1956, optical sensor 1964, optical sensor controller 1958, contact module 1930, graphics module 1932, text input module 1934, contact list 1937, and telephone module 1938, videoconferencing module 1939 includes executable instructions to initiate, conduct, and terminate a video conference between a user and one or more other participants in accordance with user instructions.

In conjunction with RF circuitry 1908, touch screen 1912, display controller 1956, contact module 1930, graphics module 1932, and text input module 1934, e-mail client module 1940 includes executable instructions to create, send, receive, and manage e-mail in response to user instructions. In conjunction with image management module 1944, e-mail client module 1940 makes it very easy to create and send e-mails with still or video images taken by imaging module 1943.

In conjunction with RF circuitry 1908, touch screen 1912, display controller 1956, contact module 1930, graphics module 1932, and text input module 1934, the instant messaging module 1941 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 1908, touch screen 1912, display controller 1956, contact module 1930, graphics module 1932, text input module 1934, GPS module 1935, map module 1954, and music player module 1946, workout support module 1942 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 1912, display controller 1956, optical sensor(s) 1964, camera(s) 1970, optical sensor controller 1958, light source module 1975 (see FIG. 16B), contact module 1930, graphics module 1932, and image management module 1944, imaging module 1943 includes executable instructions to capture still images or video (including a video stream) and store them into memory 1902, modify characteristics of a still image or video, or delete a still image or video from memory 1902.

In conjunction with touch screen 1912, display controller 1956, optical sensor(s) 1964, camera(s) 1970, contact module 1930, graphics module 1932, text input module 1934, light source module 1975 (see FIG. 16B), and imaging module 1943, image management module 1944 includes executable instructions to arrange, modify (e.g., edit), or otherwise manipulate, label, delete, present (e.g., in a digital slide show or album), and store still and/or video images.

In conjunction with RF circuitry 1908, touch screen 1912, display system controller 1956, contact module 1930, graphics module 1932, and text input module 1934, browser module 1947 includes executable instructions to browse the Internet in accordance with user instructions, including searching, linking to, receiving, and displaying web pages or portions thereof, as well as attachments and other files linked to web pages.

In conjunction with RF circuitry 1908, touch screen 1912, display system controller 1956, contact module 1930, graphics module 1932, text input module 1934, e-mail client module 1940, and browser module 1947, calendar module 1948 includes executable instructions to create, display, modify, and store calendars and data associated with calendars (e.g., calendar entries, to do lists, etc.) in accordance with user instructions.

In conjunction with RF circuitry 1908, touch screen 1912, display system controller 1956, contact module 1930, graphics module 1932, text input module 1934, and browser module 1947, widget modules 1949 are mini-applications that may be downloaded and used by a user (e.g., weather widget 1949-1, stocks widget 1949-2, calculator widget 1949-3, alarm clock widget 1949-4, and dictionary widget 1949-5) or created by the user (e.g., user-created widget 1949-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 1908, touch screen 1912, display system controller 1956, contact module 1930, graphics module 1932, text input module 1934, and browser module 1947, the widget creator module 1950 may be used by a user to create widgets (e.g., turning a user-specified portion of a web page into a widget).

In conjunction with touch screen 1912, display system controller 1956, contact module 1930, graphics module 1932, and text input module 1934, search module 1951 includes executable instructions to search for text, music, sound, image, video, and/or other files in memory 1902 that match one or more search criteria (e.g., one or more user-specified search terms) in accordance with user instructions.

In conjunction with touch screen 1912, display system controller 1956, contact module 1930, graphics module 1932, audio circuitry 1910, speaker 1911, RF circuitry 1908, and browser module 1947, video and music player module 1952 includes executable instructions that allow the user to download and play back recorded music and other sound files stored in one or more file formats, such as MP3 or AAC files, and executable instructions to display, present or otherwise play back videos (e.g., on touch screen 1912 or on an external, connected display via external port 1924). In some embodiments, device 1900 may include the functionality of an MP3 player.

In conjunction with touch screen 1912, display controller 1956, contact module 1930, graphics module 1932, and text input module 1934, notes module 1953 includes executable instructions to create and manage notes, to do lists, and the like in accordance with user instructions.

In conjunction with RF circuitry 1908, touch screen 1912, display system controller 1956, contact module 1930, graphics module 1932, text input module 1934, GPS module 1935, and browser module 1947, map module 1954 may be used to receive, display, modify, and store maps and data associated with maps (e.g., driving directions; data on stores and other points of interest at or near a particular location; and other location-based data) in accordance with user instructions.

In conjunction with touch screen 1912, display system controller 1956, contact module 1930, graphics module 1932, audio circuitry 1910, speaker 1911, RF circuitry 1908, text input module 1934, e-mail client module 1940, and browser module 1947, online video module 1955 includes instructions that allow the user to access, browse, receive (e.g., by streaming and/or download), play back (e.g., on the touch screen or on an external, connected display via external port 1924), send an e-mail with a link to a particular online video, and otherwise manage online videos in one or more file formats, such as H.264. In some embodiments, instant messaging module 1941, rather than e-mail client module 1940, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 1902 may store a subset of the modules and data structures identified above. Furthermore, memory 1902 may store additional modules and data structures not described above.

In some embodiments, device 1900 is a device where operation of a predefined set of functions on the device is performed exclusively through a touch screen and/or a touchpad. By using a touch screen and/or a touchpad as the primary input control device for operation of device 1900, the number of physical input control devices (such as push buttons, dials, and the like) on device 1900 may be reduced.

The predefined set of functions that may be performed exclusively through a touch screen and/or a touchpad include navigation between user interfaces. In some embodiments, the touchpad, when touched by the user, navigates device 1900 to a main, home, or root menu from any user interface that may be displayed on device 1900. In such embodiments, the touchpad may be referred to as a "menu button." In some other embodiments, the menu button may be a physical push button or other physical input control device instead of a touchpad.

Example Computing Device

Figure 17:
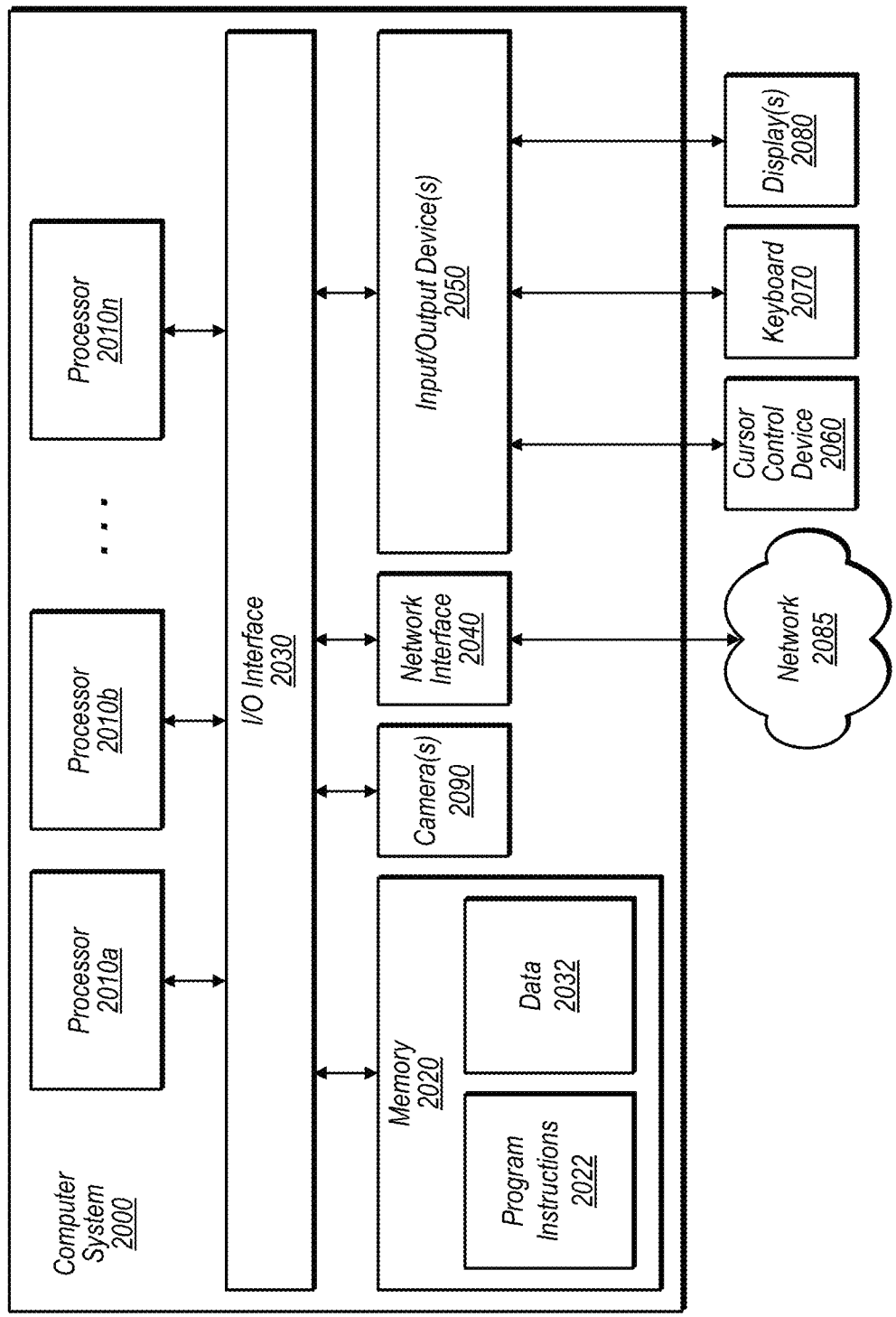
FIG. 17 illustrates an example computer system that may be used in embodiments.

FIG. 17 illustrates an example computing device, referred to as computer system 2000, that may include or host embodiments of a camera including an embedded ceramic substrate package as illustrated in FIGS. 1 through 8C. In addition, computer system 2000 may implement methods for controlling operations of the camera and/or for performing image processing of images captured with the camera. In different embodiments, computer system 2000 may be any of various types of devices, including, but not limited to, a personal computer system, desktop computer, laptop, notebook, tablet or pad device, slate, or netbook computer, mainframe computer system, handheld computer, workstation, network computer, a camera, a set top box, a mobile device (see e.g., FIG. 1), a wireless phone, a smartphone (see e.g., FIG. 1), a consumer device, video game console, handheld video game device, application server, storage device, a television, a video recording device, a peripheral device such as a switch, modem, router, or in general any type of computing or electronic device.

In the illustrated embodiment, computer system 2000 includes one or more processors 2010 coupled to a system memory 2020 via an input/output (I/O) interface 2030. Computer system 2000 further includes a network interface 2040 coupled to I/O interface 2030, and one or more input/output devices 2050, such as cursor control device 2060, keyboard 2070, and display(s) 2080. Computer system 2000 may also include one or more cameras 2090, which may also be coupled to I/O interface 2030.

In various embodiments, computer system 2000 may be a uniprocessor system including one processor 2010, or a multiprocessor system including several processors 2010 (e.g., two, four, eight, or another suitable number). Processors 2010 may be any suitable processor capable of executing instructions. For example, in various embodiments processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store program instructions 2022 and/or data 2032 accessible by processor 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions 2022 may be configured to implement various interfaces, methods and/or data for controlling operations of camera 2090 and for capturing and processing images with integrated camera 2090 or other methods or data, for example interfaces and methods for capturing, displaying, processing, and storing images captured with camera 2090. The camera(s) 2090 include at least one camera module formed according to at least one of the processes illustrated and described herein with respect to FIGS. 2A through 15. In some embodiments, program instructions and/or data may be received, sent or stored upon different types of computer-accessible media or on similar media separate from system memory 2020 or computer system 2000.

In one embodiment, I/O interface 2030 may be configured to coordinate I/O traffic between processor 2010, system memory 2020, and any peripheral devices in the device, including network interface 2040 or other peripheral interfaces, such as input/output devices 2050. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices attached to a network 2085 (e.g., carrier or agent devices) or between nodes of computer system 2000. Network 2085 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 2040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 2050 may, in some embodiments, include one or more display terminals, keyboards, keypads, touchpads, scanning devices, voice or optical recognition devices, or any other devices suitable for entering or accessing data by computer system 2000. Multiple input/output devices 2050 may be present in computer system 2000 or may be distributed on various nodes of computer system 2000. In some embodiments, similar input/output devices may be separate from computer system 2000 and may interact with one or more nodes of computer system 2000 through a wired or wireless connection, such as over network interface 2040.

As shown in FIG. 17, memory 2020 may include program instructions 2022, which may be processor-executable to implement any element or action to support integrated camera 2090, including but not limited to image processing software and interface software for controlling camera 2090. In some embodiments, images captured by camera 2090 may be stored to memory 2020. In addition, metadata for images captured by camera 2090 may be stored to memory 2020.

Those skilled in the art will appreciate that computer system 2000 is merely illustrative and is not intended to limit the scope of embodiments. In particular, the computer system and devices may include any combination of hardware or software that can perform the indicated functions, including computers, network devices, Internet appliances, PDAs, wireless phones, pagers, video or still cameras, etc. Computer system 2000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 2000 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 2000 may be transmitted to computer system 2000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera module, comprising:
   an image sensor configured to capture light projected onto a surface of the image sensor; and
   an embedded ceramic substrate package directly attached to the image sensor, the embedded ceramic substrate package comprising:
      a bulk molding compound (BMC);
      a ceramic substrate embedded in the BMC; and
      one or more redistribution layers (RDLs) coupled to the BMC, at least one of the RDLs being on at least one surface of the BMC;
   wherein at least one of the BMC or one of the RDLs is directly attached to the image sensor, and wherein at least one of the BMC or one of the RDLs includes electrical signal trace routing coupled to the image sensor.

2. The camera module as recited in claim 1, wherein:
   the ceramic substrate of the embedded ceramic substrate package overlies a flexible printed circuit (FPC); and
   the ceramic substrate overlying the FPC is overmolded with the BMC.

3. The camera module as recited in claim 2, wherein at least a portion of the electrical signal trace routing is disposed within the BMC.

4. The camera module as recited in claim 3, wherein the image sensor is electrically connected to the electrical signal trace routing disposed within the BMC.

5. The camera module as recited in claim 1, wherein:
   at least a portion of the RDL includes the electrical signal trace routing;
   the ceramic substrate of the embedded ceramic substrate package overlies the RDL; and
   the ceramic substrate overlying the RDL is overmolded with the BMC.

6. The camera module as recited in claim 5, wherein the image sensor is electrically connected to the electrical signal trace routing of the RDL.

7. The camera module of claim 1, wherein the ceramic substrate of the embedded substrate package includes electrical circuitry on both a first surface of the ceramic substrate and a second surface of the ceramic substrate opposite the first surface.

8. The camera module as recited in claim 7, wherein the electrical circuitry consists of passive electrical circuitry.

9. The camera module of claim 1, wherein the ceramic substrate is a single-layer substrate.

10. The camera module of claim 1, wherein the ceramic substrate is a multiple-layer substrate.

11. The camera module as recited in claim 1, wherein the ceramic substrate is an alumina-based ceramic substrate.

12. The camera module as recited in claim 1, wherein at least a portion of the BMC lies above or below the image sensor in a vertical direction.

13. An embedded ceramic substrate package, comprising:
   a bulk molding compound (BMC);
   a ceramic substrate embedded in the BMC; and
   one or more redistribution layers (RDLs) coupled to the BMC, at least one of the RDLs being on at least one surface of the BMC;
   wherein at least one of the BMC or one of the RDLs is directly attached to an image sensor that is configured to capture light projected onto a surface of the image sensor; and
   wherein at least a portion of the BMC or one of the RDLs includes electrical signal trace routing coupled to the image sensor.

14. The embedded ceramic substrate package as recited in claim 13, wherein:
   the ceramic substrate overlies a flexible printed circuit (FPC); and
   the ceramic substrate overlying the FPC is overmolded with the BMC.

15. The embedded ceramic substrate package as recited in claim 14, wherein at least a portion of the electrical signal trace routing is disposed within the BMC.

16. The embedded ceramic substrate package as recited in claim 15, wherein the image sensor is electrically connected to the electrical signal trace routing disposed within the BMC.

17. The embedded ceramic substrate package as recited in claim 13, wherein:
   at least a portion of the RDL includes the electrical signal trace routing;
   the image sensor is electrically connected to the electrical signal trace routing of the RDL;
   the ceramic substrate overlies the RDL; and
   the ceramic substrate overlying the RDL is overmolded with the BMC.

18. The embedded ceramic substrate package as recited in claim 13, wherein the ceramic substrate includes electrical circuitry on both a first surface of the ceramic substrate and a second surface of the ceramic substrate opposite the first surface.

19. The embedded ceramic substrate package as recited in claim 13, wherein the ceramic substrate is a single-layer substrate.

20. A mobile device, comprising:
   one or more processors;
   one or more cameras; and
   a memory comprising program instructions executable by at least one of the one or more processors to control operations of the one or more cameras;
   wherein at least one of the cameras includes a camera module comprising:
      an image sensor configured to capture light projected onto a surface of the image sensor; and
      an embedded ceramic substrate package directly attached to the image sensor, the embedded ceramic substrate package comprising:
         a bulk molding compound (BMC);
         a ceramic substrate embedded in the BMC; and
         one or more redistribution layers (RDLs) coupled to the BMC, at least one of the RDLs being on at least one surface of the BMC;
      wherein at least one of the BMC or one of the RDLs is directly attached to the image sensor, and wherein at least a portion of the BMC or one of the RDLs includes electrical signal trace routing coupled to the image sensor.

* * * * *